US 6,716,656 B2

(12) United States Patent
Shtein et al.

(10) Patent No.: US 6,716,656 B2
(45) Date of Patent: Apr. 6, 2004

(54) SELF-ALIGNED HYBRID DEPOSITION

(75) Inventors: Max Shtein, Princeton, NJ (US); Stephen R. Forrest, Princeton, NJ (US)

(73) Assignee: The Trustees of Princeton University, Princeton, NJ (US)

(*) Notice: Subject to any disclaimer, the term of this patent is extended or adjusted under 35 U.S.C. 154(b) by 0 days.

(21) Appl. No.: 10/233,482

(22) Filed: Sep. 4, 2002

(65) Prior Publication Data

US 2003/0087471 A1 May 8, 2003

Related U.S. Application Data

(60) Provisional application No. 60/317,215, filed on Sep. 4, 2001, provisional application No. 60/316,264, filed on Sep. 4, 2001, provisional application No. 60/316,968, filed on Sep. 5, 2001, and provisional application No. 60/332,090, filed on Nov. 21, 2001.

(51) Int. Cl.⁷ .............................................. H01L 21/00
(52) U.S. Cl. ........................ 438/24; 438/82; 438/99; 438/478
(58) Field of Search .................. 438/22, 24, 34, 438/35, 98, 99, 57, 141, 73, 82, 478; 257/103; 313/506; 427/596, 248.1

(56) References Cited

U.S. PATENT DOCUMENTS

| | | | |
|---|---|---|---|
| 4,788,082 A | 11/1988 | Schmitt | |
| 5,256,205 A | 10/1993 | Schmitt, III et al. | |
| 5,641,611 A | * 6/1997 | Sheieh et al. | 430/315 |
| 5,650,197 A | 7/1997 | Halpern | |
| 5,707,745 A | 1/1998 | Forrest et al. | |
| 5,900,339 A | * 5/1999 | Roberts et al. | 430/7 |
| 5,953,587 A | 9/1999 | Forrest et al. | |
| 5,998,085 A | 12/1999 | Isberg et al. | |
| 6,013,538 A | 1/2000 | Burrows et al. | |
| 6,087,274 A | * 7/2000 | Tonucci et al. | 438/758 |
| 6,125,226 A | 9/2000 | Forrest et al. | |
| 6,160,828 A | * 12/2000 | Kozlov et al. | 372/39 |
| 6,165,543 A | * 12/2000 | Otsuki et al. | 427/66 |
| 6,214,631 B1 | * 4/2001 | Burrows et al. | 438/22 |
| 6,255,775 B1 | * 7/2001 | Ikuko et al. | 313/506 |
| 6,337,102 B1 | 1/2002 | Forrest et al. | |
| 6,403,392 B1 | 6/2002 | Burrows et al. | |
| 6,417,034 B2 | * 7/2002 | Kitazume et al. | 438/160 |
| 6,459,193 B1 | * 10/2002 | Fukuzawa et al. | 313/402 |
| 6,459,199 B1 | * 10/2002 | Kido et al. | 313/504 |
| 6,515,298 B2 | * 2/2003 | Forrest et al. | 257/40 |
| 2001/0005528 A1 | * 6/2001 | Lee et al. | 427/248.1 |
| 2002/0074938 A1 | * 6/2002 | Gu | 313/512 |
| 2002/0155230 A1 | * 10/2002 | Forrest et al. | 427/596 |
| 2003/0020073 A1 | * 1/2003 | Long et al. | 257/79 |
| 2003/0054586 A1 | * 3/2003 | Shtein et al. | 438/99 |

OTHER PUBLICATIONS

Forrest et al., U.S. patent application Ser. No. 09/663,143, filed Sep. 15, 2000, entitled "Low Pressure Vapor Phase Deposition of Organic Thin Films".

Forrest et al., U.S. patent application Publication No. 2002/0155230, published Oct. 24, 2002.

* cited by examiner

*Primary Examiner*—Savitri Mulpuri
(74) *Attorney, Agent, or Firm*—Kenyon & Kenyon

(57) ABSTRACT

A method of fabricating an organic device is provided. A first layer is deposited over a substrate through a mask by a first process that results in the first layer having a first area of coverage. A second layer is then deposited over the substrate through the mask by a second process that results in the second layer having a second area of coverage that is different from the first area of coverage.

7 Claims, 32 Drawing Sheets

1.0 Torr 0.1 Torr 0.01 Torr s = 3 µm s = 10 µm s = 20 µm $t = 18 \, \mu m$ $t = 36 \, \mu m$ $t = 54 \, \mu m$ δ = 410 μm δ = 2060 μm

SELF-ALIGNED HYBRID DEPOSITION

CROSS-REFERENCE TO RELATED APPLICATIONS

This patent application claims priority benefits to the following U.S. patent applications: 60/317,215 (filed Sep. 4, 2001), 60/316,264 (filed on Sep. 4, 2001), 60/316,968 (filed on Sep. 5, 2001), and 60/332,090 (filed Nov. 21, 2001). These patent applications are incorporated by reference in their entireties. This patent application is related to patent application Ser. No. 10/233,470 (filed on Sep. 4, 2002), which is incorporated by reference in its entirety.

STATEMENT REGARDING GOVERNMENT RIGHTS

This invention was made with Government support under Contract No. F49620-92-J-05 24 (Princeton University), awarded by the U.S. Air Force OSR (Office of Scientific Research). The Government has certain rights in this invention.

FIELD OF THE INVENTION

The present invention is directed to a method of fabricating organic semiconductor devices such as organic light emitting devices. More particularly, the invention is directed to the fabrication of such devices where organic materials are deposited through a mask.

SUMMARY OF THE INVENTION

A method of fabricating a device is provided. The method may be referred to as a "hybrid" method, because different deposition processes are used to deposit organic layers and metal layers, and the differences in these processes are favorably used to facilitate the method. A shadow mask is positioned at a particular distance from a substrate. An organic layer is then deposited through the mask using organic vapor phase deposition (OVPD). A metal (or conductive metal oxide) layer is subsequently deposited through the same mask using vacuum thermal evaporation (VTE). The organic layer may be made reliably and controllably larger than the metal layer because of the differences between OVPD and VTE, even though both the organic and metal layers are deposited through the same mask. A method of fabricating an organic device is provided. A first layer is deposited over a substrate through a mask by a first process that results in the first layer having a first area of coverage. A second layer is then deposited over the substrate through the mask by a second process that results in the second layer having a second area of coverage that is different from the first area of coverage.

Another method of fabricating a device is also provided. The hybrid method described above is used to deposit a first organic layer, and then a first metal layer, through a mask, where the mask is disposed at a first position. The mask is then be moved to a second position that may be determined relative to the first position. The hybrid method is then used to deposit a second organic layer, and then a second metal layer, through the mask. The mask may then be moved to a third position that may be determined relative to the second position. The hybrid method is then used to deposit a third organic layer, and then a third metal layer, through the mask. The substrate may be moved in addition to or instead of the mask.

In each method provided, the substrate may be cooled during the deposition of the organic layers.

It is an object of the invention to provide an improved method of fabricating organic semiconductor devices that use less steps than prior methods.

It is a further object of the invention to provide an improved method of fabricating organic semiconductor devices that takes advantage of the OVPD process.

DETAILED DESCRIPTION

Figure 1:
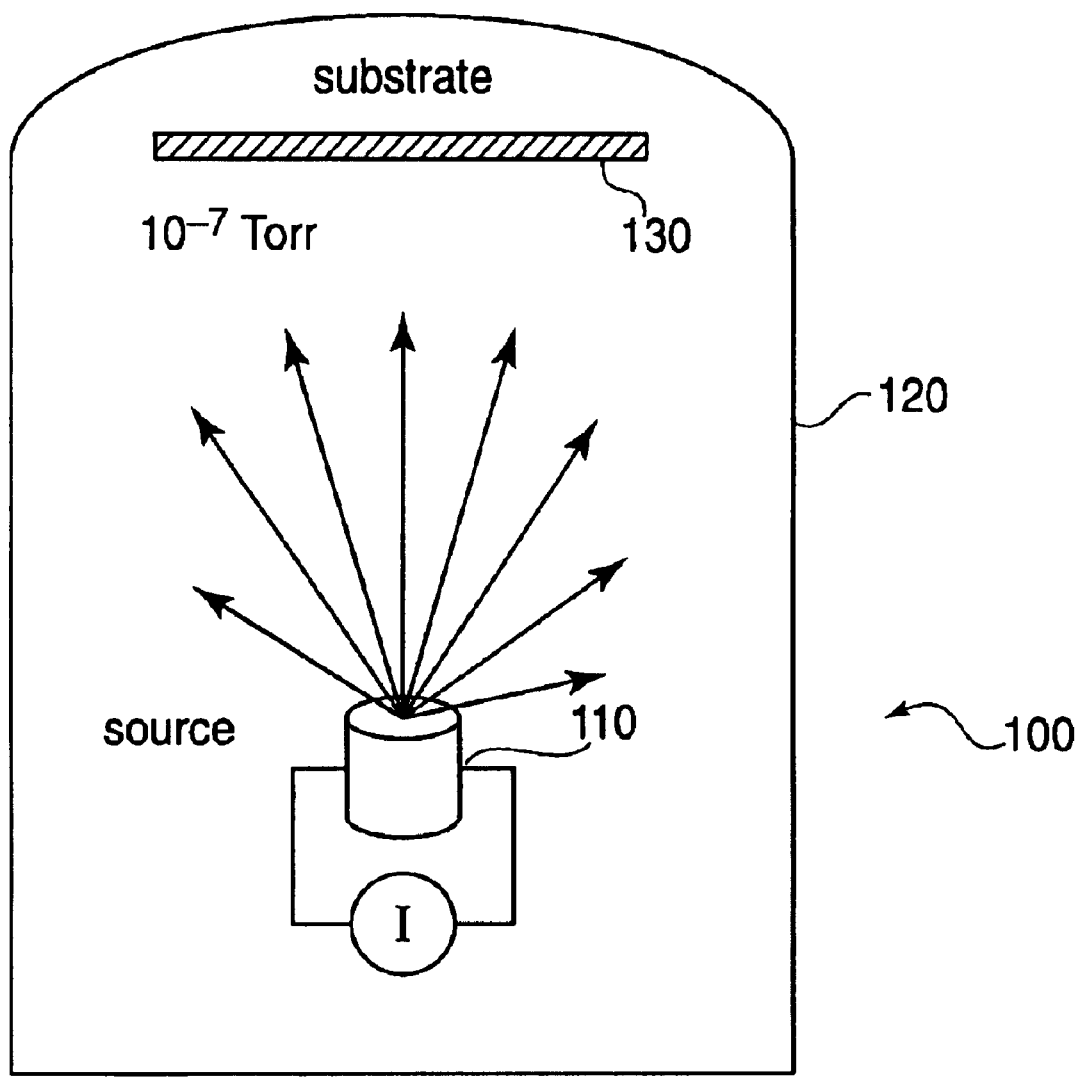
FIG. 1 shows a vacuum thermal evaporation system.

The same mask, with the same apertures, may be used to pattern both metal and organic layers of an organic device. Organic layers deposited by organic vapor phase deposition (OVPD) are subject to a natural and controllable spreading, depending upon process parameters such as the vapor pressure and the geometry of the mask and substrate. Metal layers deposited by vacuum thermal evaporation (VTE) generally have much less spreading. As a result, it is possible to deposit different patterns though the same mask apertures, such that the patterned organic layers are larger than the patterned metal layers. The organic device may be an organic light emitting device (OLED), or a different type of organic device, such as an organic transistor or an organic solar cell. A wide variety of devices may be fabricated, including organic passive matrix displays and organic active matrix displays.

An organic layer and then a metal layer may be deposited, in sequence, through the same shadow mask. Because of differences in the deposition method, the organic layer may have greater spreading, and the metal layer may be disposed entirely on the organic layer, such that there is no contact between the metal layer and any layers underneath the organic layer. Shorts are therefore advantageously avoided. This process may be utilized to advantageously fabricate an organic device, such as an organic light emitting device (OLED).

OLEDs makes use of thin organic films that emit light when voltage is applied across the device. OLEDs are becoming an increasingly popular technology for applications such as flat panel displays, illumination, and backlighting. OLED configurations include double heterostructure, single heterostructure, and single layer, and a wide variety of organic materials may be used to fabricate OLEDs. Several OLED materials and configurations are described in U.S. Pat. No. 5,707,745, which is incorporated herein by reference in its entirety.

Many modern organic electronic and nanostructure devices require lateral pattern resolution on the order of microns, but are incompatible with conventional photolithography. In-situ patterning of the organic films is often used instead Embodiments of the invention may involve the movement of a shadow mask in between the deposition of various layers of material. A description of such movement may be found in a patent application having attorney docket number 10020/11501, which is incorporated herein by reference in its entirety. An array of devices may be fabricated by moving the mask (or substrate) as follows. After using the mask, disposed in a first position, to deposit a first organic layer and a first metal layer, the mask may be moved to a second position determined relative to the first position. A second organic layer, and then a second metal layer, may be deposited through the mask at the second position. Because the second position is determined relative to the first position, costly and time consuming alignment steps may advantageously be avoided. After depositing the second organic layer and the second metal layer, the mask may be moved to a third position determined relative to the second position. A third organic layer, and then a third metal layer, may be deposited through the mask at the third position. This process may be advantageously used, for example, to fabricate a three color OLED display, where the first, second, and third organic layers are each adapted to emit a different color of light.

An embodiment of the invention may be used to fabricate a multi-color array of OLEDs having well-defined pixels with a resolution of 5 microns or greater. The fact that separate alignment steps are not necessary for each material (metal as opposed to organic), nor for each color, enhances the resolution available.

Embodiments of the present invention may involve the use of organic vapor phase deposition (OVPD). A description of organic vapor phase deposition may be found in patent applications having attorney docket numbers 10020/37, 10020/3702, and 10020/3703, which are incorporated herein by reference in their entirety.

Vacuum Thermal Evaporation (VTE)

FIG. 1 shows a vacuum thermal evaporation (VTE) system 100. A source 110 is heated such that material evaporates into a vacuum chamber 120. The material diffuses through vacuum to substrate 130, where it may be deposited.

Figure 2:
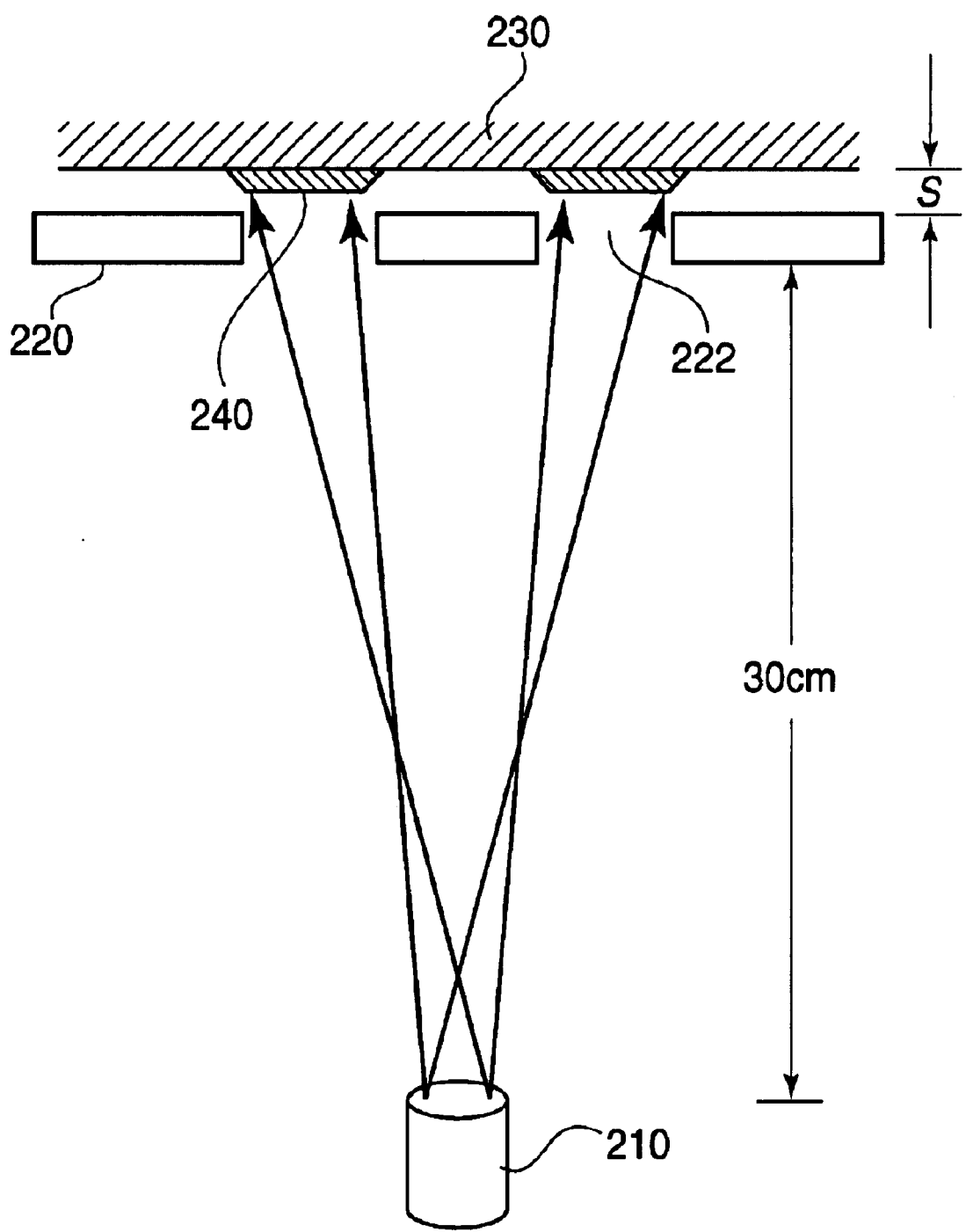
FIG. 2 shows a vacuum thermal evaporation system.

FIG. 2 shows a more detailed view of a VTE system 200 having a mask 220. A source 210 provides organic material that diffuses into a vacuum, on the order of $10^{-6}$ to $10^{-7}$ Torr. The organic material diffuses through the vacuum and through a shadow mask 320. Shadow mask 220, which has apertures 222, is disposed a distance s away from a substrate 230. After the organic material passes through the shadow mask, it deposits on substrate 230 to form patterned organic layer 240.

Because of the low pressures typically used for VTE, the molecular mean free path, $\lambda$, (also referred to as mfp) may be quite large. For example, at $10^{-7}$ Torr, $\lambda$ is about 1 m. As a result, for example, a mask-substrate separation of less than 50 $\mu$m can yield pixels of up to ~100 $\mu$m with well-defined edges, where the source-substrate distance in the chamber is on the order of 10–100 cm. Preferably, the distance between substrate 230 and source 210 is less than the molecular mean free path $\lambda$, such that collisions between molecules in the vacuum are minimal, and patterned layer 240 is deposited where there is a clear line of sight from substrate 230 to source 210, unblocked by mask 220. Using VTE, a pixel profile that is trapezoid with a well-defined, finite base may be obtained. $10^{-3}$ to $10^{-13}$ Pa is a preferred range of pressures for VTE.

Because source 210 is not a single point, patterned layer 240 may be slightly larger than aperture 222. With reference to FIG. 2, the length of the base of patterned layer 240, $l_3$, is given by:

$$l_3 = \frac{1}{2} \cdot \frac{(s+t) \cdot (l_1 + l_2)}{h} \quad (1)$$

where s=mask-substrate separation, t=mask thickness, $l_1$=source width, $l_2$=aperture width, and h=source-mask distance. This formula gives very close d values to those observed experimentally.

Organic Vapor Phase Deposition

Organic Vapor Phase Deposition (OVPD) is well suited for depositing amorphous and crystalline organic thin films for display, transistor, and photovoltaic applications. It is radically different from vacuum thermal evaporation in that it uses a carrier gas to transport organic vapors into a deposition chamber, where the molecules diffuse across a boundary layer and physisorb on the substrate. Preferably, the carrier gas is inert. Control over dopant concentration, purity, and crystallinity of the deposited films can be significantly improved over vacuum thermal evaporation (VTE). Here, we examine film deposition from the vapor phase in experimental and modeling detail, with emphasis on shadow mask patterning, a critical step in the fabrication of full-color OLED-based displays. While it is relatively easy to achieve sharply defined pixels using vacuum thermal evaporation at pressures <$10^{-6}$ because the molecular mean free path, $\lambda$, is typically >30 cm, the situation is more complicated in OVPD. Because OVPD typically proceeds at pressures >$10^{-2}$ Torr, with 0.1 $\mu$m<$\lambda$<1 cm, the increased frequency of intermolecular collisions in the vicinity of the mask plane leads to pixels with comparatively more diffuse edges. Deposition pressures in the range of 1 to $10^3$ Pa are also preferred, with the molecular mean free path (mfp) ranging from $10^3$ to 1 mm, respectively. Nevertheless, in this work we show that deposition with pattern definition of about 1 $\mu$m can be achieved under the appropriate conditions of substrate temperature, reactor pressure, and mask geometry. Our results reveal the dynamics of growth of ordered organic films in the different material transport regimes encountered in OVPD—the free molecular, the diffusive, and the intermediate of the two—and help identify useful processing conditions and guide the design of OVPD systems.

The technique of Organic Vapor Phase Deposition (OVPD) is becoming increasingly widespread in depositing amorphous and crystalline organic thin films for display, transistor, and photovoltaic applications. It is particularly attractive for fabrication of molecular organic LEDs due to low operation cost and ease of scale-up as compared to vacuum thermal evaporation (VTE). Low Pressure OVPD (LP-OVPD) has been used previously in depositing optically non-linear salts, optically pumped organic laser, efficient organic light emitting diodes (OLEDs), and pentacene channel thin film transistors (TFTs). Since OVPD inherently differs from VTE in the use of a carrier gas, the mass transport mechanism is also radically different. Film deposition at intermediate (0.1–100) Knudsen numbers encountered in OVPD are examined, both experimentally and by Monte-Carlo computer simulation. In particular, we examine the patterning of organic films via shadow-masking, which has special relevance to the deposition of multiple color pixels on the same substrate, for example for use in a full color OLED display fabrication.

Thus, simulations of organic film patterning by OVPD may also examine the transition flow regime.

The Knudsen number, Kn=mfp/d, characterizes the different transport regimes encountered in gas flow processes in terms of the molecular mean free path, mfp, divided by the critical apparatus dimension, d. For Kn<<1, molecule-molecule collisions are far more frequent than molecule-wall collisions, and mass transport is described by Poiseuille flow. The analogous method of metallo-organic chemical vapor deposition (MOCVD), used to growth inorganic semiconductor thin films and heterostructures, frequently occurs in this flow regime.

For deposition of unpatterned thin films, OVPD typically takes place at Kn<<1. However, for the purpose of high resolution film patterning, other flow regimes may be preferred, depending on $P_{dep}$ and whether d corresponds to the pattern size, resolution, or aperture width.

Although molecular flow through small channels has been previously studied for a range of Kn using several different techniques (molecular beam epitaxy, gas dosing, gas permeation of membranes, aerosol filtration, etc.), with the variably collimated fluxes having the same general characteristics as shown in FIG. 2, the results are not readily nor rigorously applicable to micropatterning of organic thin films by OVPD. Molecular beam studies typically involve highly rarified fluxes of identical molecules or atoms, leading to line-of-sight deposition. In contrast, gas dosing experiments use dense gases and large channels (diameter>>mfp), with the hydrodynamics of the flow described by Navier-Stokes equations. The gas flow pattern is also typically unaffected by the presence of a condensing surface. The studies of gas and gas-driven particle transport in porous media are generally concerned with bulk variables.[22,23] Technical literature contains several diffusion- and Monte-Carlo-based studies of reactive ion etching and deposition in via holes and trenches for similar Kn regimes as in OVPD, albeit for sub-micron aperture dimensions. This study uses a combination of patterned deposition experiments and Monte-Carlo simulations to study micropatterning by OVPD. The treatment is simplified by neglecting gas-phase and surface reactions and molecule or particle re-emission which must be considered for reactive deposition or etch.

In OVPD, the carrier gas flow creates a hydrodynamic boundary layer at the substrate, ranging from 1 mm to ~5 cm in depth. In previous studies the film deposition rate has been shown to be limited by diffusion across this boundary layer. Generally, the organics are a minority species (<1% by mole) and diffuse through a background of the carrier gas, suffering collisions en route to the substrate.

Monte-Carlo simulations of patterned OVPD indicate that when the mfp is on the order of the pattern size, deposit edges often become less defined. The control of pattern resolution is achieved by varying the mfp, the bulk gas flow velocity, and aperture geometry. The Monte-Carlo simulations and OVPD experiments demonstrate that patterns as small as 1 $\mu$m can be achieved, with the deposit profile depending strongly on the pressure, aperture shape and distance from the substrate. A weaker dependence on the mfp and bulk flow velocity is also found. Operating conditions and aperture geometries are identified for achieving highest resolution.

Process parameters that may be significant for OVPD include evaporation and reactor wall temperatures ($T_{evap}$, $T_{wall}$), carrier gas flow rate ($\dot{V}$), and deposition pressure ($P_{dep}$), with preferred film deposition conditions characterized by 1 Pa<$P_{dep}$<$10^3$ Pa, 500 K <$T_{evap}$, $T_{wall}$<700 K, and 10 sccm<$\dot{V}$<1000 sccm. In this process window, the vapor pressure of the organic molecular species is $10^{-2}$–$10^1$ Pa, keeping the organic materials volatile yet chemically stable[5-7] and the gas phase molecular diffusion rate is on the order of the bulk carrier gas flow, promoting film deposition rate and uniformity. Layer thickness control can be achieved either by means of a mechanical shutter, or by regulating $\dot{V}$, or a combination of both. A preferred processing window for OVPD is as follows. The lower bound on the pressure at the source is ~1 Pa. Below this value the pressure drop from the source inlet to the substrate is insufficient to drive the gas flow, and that transport of organics can become diffusion-dominated and poorly controlled. The upper bound to the pressure in the deposition region, $P_{dep}$, is ~1 kPa, limited by the decreasing diffusivity of organic vapor with pressure. In the pressure range from 1 to $10^3$ Pa, the molecular transport changes from the Knudsen regime encountered in VTE, to the diffusive regime, and the character of deposition may be changed significantly.

Figure 3:
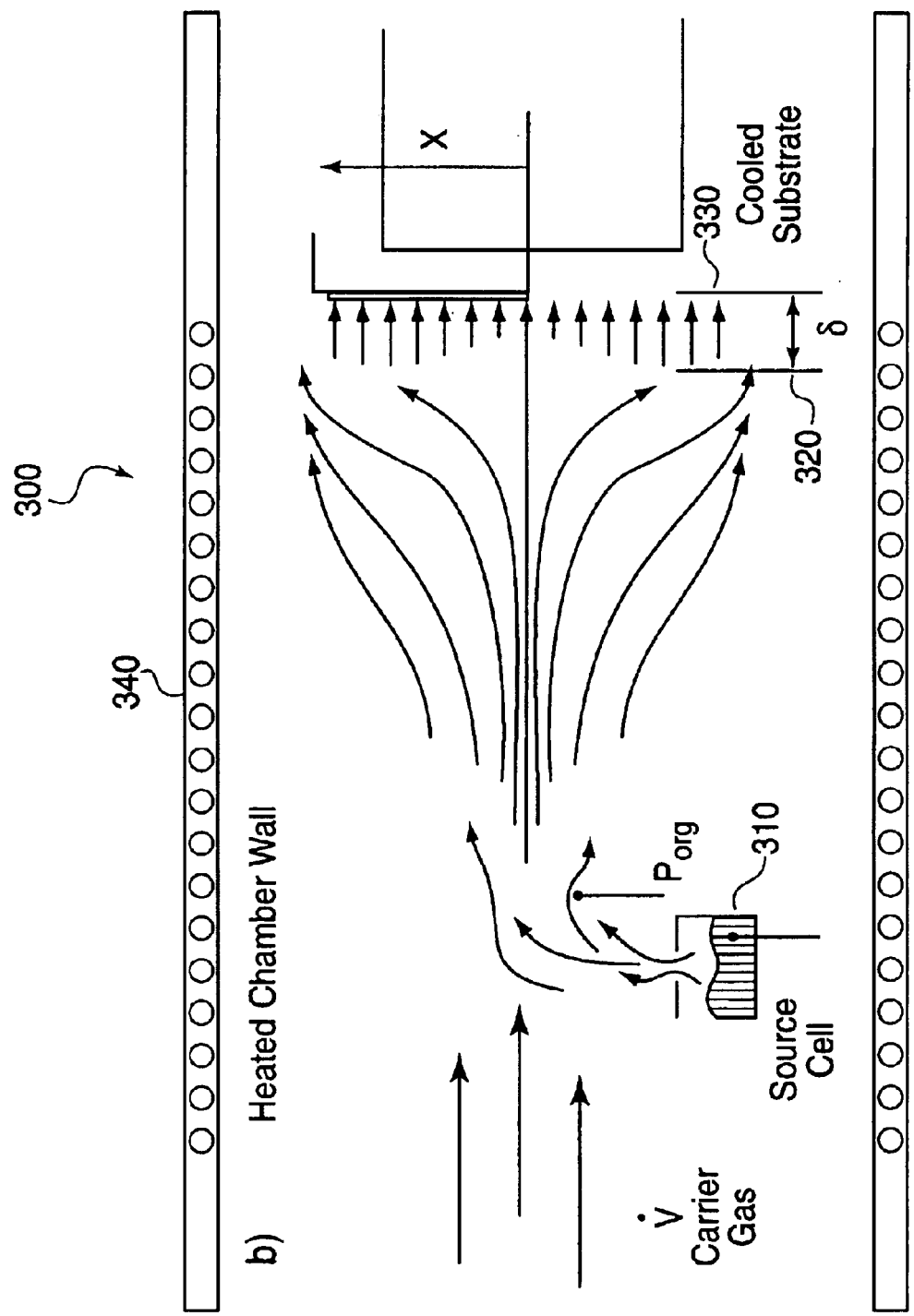
FIG. 3 shows an organic vapor phase deposition system.

FIG. 3 shows a organic vapor phase deposition (OVPD) system 300. A carrier gas is passed over a source cell 310, from which an organic material is evaporated into the carrier gas. Multiple source cells (not shown) may be used to provide a mixture of organic materials, and/or to provide different organic materials at different times. The carrier gas then passes through a mask 320 located a distance δ from a substrate 330. The carrier gas then impinges on substrate 330, where the organic material physisorbs onto the substrate surface. Substrate 330 may be cooled. Walls 340 of system 300 may be heated to reduce or prevent organic material from depositing on walls 340. The organic material may be a small molecule material, or it may be a polymer material.

Spatially and temporally separating evaporation and deposition in OVPD allows independent and precise control over the deposition rate, dopant concentration, and coating uniformity of molecular organic thin films. Preferably, the deposition pressures ranges between about 0.01 and 10 Torr. Amorphous thin films (e.g. α-NPD, Alq$_3$), as well as crystalline thin films (e.g. perylene, pentacene), may be grown.

Figure 4:
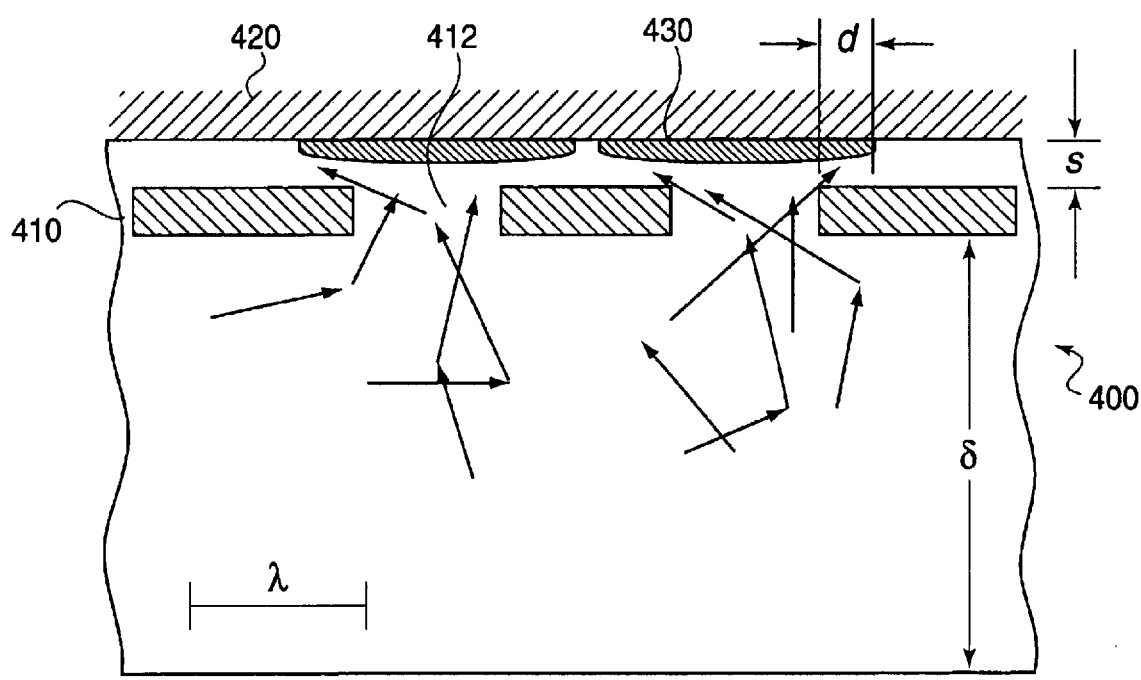
FIG. 4 shows an organic vapor phase deposition system.

In OVPD, the adsorbing organic molecules are uniformly distributed above the entire substrate area, which can be regarded as a quasi-infinite collection of point-evaporation sources situated near the mask. In the preferred range of pressures of 0.01 to 10 Torr used in OVPD, λ for the carrier gas molecules (e.g. nitrogen, argon) ranges from 1 cm to 0.1 µm, respectively. Hence, with shadow mask features on the order of a micrometer, the variability in the frequency of molecular collisions above and below the mask at the different pressures can lead to a significant variation in the sharpness of the pixel profile, as illustrated in FIG. 4. FIG. 4 shows an OVPD system 400. A carrier gas is used to transport organic molecules from a source (not shown in FIG. 4, see, for example, FIG. 3). The molecules have an average mean free path λ. A mask 410 is disposed a distance s above a substrate 420. Organic layer 430 is deposited on substrate 420 through apertures 412 in mask 410. Because of collisions between molecules in the carrier gas, significant deposition of organic material may occur to a distance d under the mask, in regions that are not directly over apertures 412. The deposition is preferably carried out in at the lower end of the pressure range, such that the mean free path is greater than it would be at higher pressures, and d is correspondingly less, so that the micron-scale resolution preferred for full-color display applications may be achieved.

With qualifications with respect to the highly molecular nature of OVPD, we can state that, preferably, the ratio of carrier gas velocity to the mean molecular velocity, $v_c/u$, is about 0.01–1, i.e. the flow in LP-OVPD is either below or borders on the sonic regime. Due to the low pressure used, the Reynolds number, Re, is well within the laminar flow regime (Re<<2000). The Grashof number, Gr, in the vicinity of the substrate is also less than 1, implying that natural convection is not significant in gas mixing near the substrate. For the present discussion of deposition dynamics, transport to the substrate, diffusion to the substrate surface, and surface diffusion and immobilization are most relevant. Since the efficient deposition of amorphous thin films preferably involves minimal surface diffusion and desorption, the lowest practicable substrate temperatures are preferably used. Two things happen in this case: $k_{ads} >> k_{des}$, while the crystallization rate, $k_c$, is very high, meaning that the surface diffusing organic molecules become immobilized much faster than they diffuse to the substrate. Thus, surface diffusion and immobilization is very fast and may not be considered rate limiting for deposition of amorphous films. The rate-limiting steps are thus transport to the surface and diffusion to the substrate surface.

As shown in previous work, the overall deposition rate, $r_{dep}$ can be expressed as:

$$r_{dep} = \frac{P_{org}}{RT} \cdot \frac{\dot{V}}{1 + \dot{V}\delta/D_{org}} \quad (2)$$

where $P_{org}/RT$ is the concentration of the organic species, V dot is the carrier gas flow rate, δ is the BL thickness, and $D_{org}$ is the diffusivity of organic molecules in the carrier gas. The kinematic viscosity itself depends on pressure via: ν=µ/ρ, where ρ=P/RT. Increasing the background gas pressure, $P_{dep}$, may result in a sublinear decrease in the deposition rate, $r_{dep}$, due to two opposing factors: a decrease in the diffusivity, $D_{org}$, which lowers $r_{dep}$, and a decrease in δ, which improves the transport rate. This equation may be used to predict the overall deposition rate for given process conditions and, coupled with a surface molecular diffusion model, to estimate crystallization rate and grain size of polycrystalline thin films.

In the vicinity of the substrate the system may be engineered and modeled as a gas jet impinging normal to a flat plate, a uniform flow coming to stagnation near a flat plate, or flow impinging on a rotating disk (to improve coating uniformity); in all cases, δ takes the form:

$$\delta = 2.4\sqrt{\frac{\nu}{\alpha}} \quad (3)$$

where ν is the kinematic viscosity of the gas, and α is a quantity that decreases linearly with V dot and/or the rate of rotation in such a way that the formula may be used directly to estimate δ in units of cm when ν is in cm$^2$/s and bulk flow axial velocity in cm/s is used for α. For the preferred conditions used in OVPD and in this work, such as T=275° C., $P_{dep}$=0.2 Torr and V dot=15 sccm of nitrogen, δ is approximately equal to 1–10 cm. However, since the δ is not significantly smaller than the axial dimension of the typical deposition chamber (1–30 cm), the term boundary layer must be applied in OVPD with caution.

OVPD THROUGH A SHADOW MASK

The preceding discussion relies on the validity of the continuum assumption due to the use of the uniform bulk diffusivity, $D_{org}$, and the boundary layer thickness, $\delta$. This section examines the validity of the continuum assumption when applied to shadow masking in OVPD.

The extent to which the organic molecules retain their initial bulk flow velocity when they arrive at the mask plane is a factor that may affect OVPD. First, we assume the presence of a boundary layer, BL, where by definition, the molecules lose memory of bulk transport, and their velocity distribution is fully thermalized. In this case, it can be seen qualitatively that the decrease in $D_{org}$ due to higher $P_{dep}$ will not make the patterns less sharp. Since $D_{org}$ is isotropic, the longer it takes for a molecule to diffuse perpendicularly to the substrate, the longer it will take (by the same amount) for it to diffuse laterally. The mutual cancellation of these rates will result in identical patterns at different pressures, which is not the observed experimental trend. A slightly more realistic model for $D_{org}$ (see Eq.(8) below, for example) is where it decreases in the direction of the substrate, along the decreasing temperature gradient. But once again, because the decrease is isotropic, the pattern should remain unaffected.

Relaxing the requirement for an isotropic velocity distribution within the boundary layer and allowing the molecules to retain the z-component of their initial velocity, it can be shown that:

$$d_{max} \approx const \cdot \sqrt{6 \cdot D_{org} \cdot \frac{s}{u}} \quad (4)$$

where $d_{max}$ is the pixel edge dispersion, as shown in FIG. 4, and u is the carrier gas velocity in the deposition chamber. Here, we assumed that $\lambda$ is small enough to model the process as diffusion from a series of point sources located along the mask aperture. The pixel edge dispersion increases with the square root of the pressure, through $D_{org}$, as well as the mask-substrate separation, s. Increasing the bulk flow velocity, naturally for this model, improves sharpness. However, this formula overestimates the pixel edge dispersion for moderate pressures (e.g. 0.1 Torr) by at least an order of magnitude, because the diffusive transport assumption does not strictly hold for the dimensions and pressures relevant to this discussion. Experimentally obtained deposition patterns suggest that the mechanism lies somewhere between the two diffusive modes. Here, it should be noted that the continuum and hence the diffusion assumptions are incorrect for most of OVPD conditions. As remarked earlier, the Knudsen number ($\lambda$/L, where L=characteristic length) based on the dimensions of the shadow mask is large, and the mass and energy conservation equations no longer form a closed set. The random collisions experienced by the organic molecules near the substrate are responsible for the lateral spreading of the pixels. Since, by definition, the complete randomization of molecular velocities takes place within the BL, the magnitude of $\delta$ is expected to affect the sharpness of the pattern. Furthermore, the latter will be limited by the following factors: molecular mean free path, $\lambda$, mask-to-substrate separation, s, and the shape of the mask aperture. In terms of the process parameters, these factors are controlled via the deposition pressure, carrier gas flow rate, the type of carrier gas used, and design of the shadow mask. Since $D_{org}$ and $\lambda$ are intimately related, we next examine how $\lambda$ varies with $P_{dep}$ and its effect on pattern sharpness.

A Monte-Carlo type simulation may be used to model deposition through a shadow mask. With reference to FIG. 4, a larger $\lambda$ will result in fewer intermolecular collisions inside the BL and, coupled with a laterally uniform concentration distribution above the shadow mask, less lateral dispersion of the pattern on the substrate. For a single-component, low-pressure non-polar gas, $\lambda$ has the form:

$$\lambda = \frac{k_B \cdot T}{\sqrt{2} \cdot \pi \cdot \sigma^2 \cdot P_{dep}} \quad (5)$$

Thus, by decreasing the gas pressure, the mean free path increases and sharper pixels will be obtained. However, pressure cannot be decreased indefinitely; the in-flow of a carrier gas used to transport the organic vapors necessarily gives rise to a background gas pressure. The limit of very low deposition pressure, $P_{dep}$, represents the free molecular transport regime, where $\lambda$ is large and the carrier gas flow rate, V dot, limits material transport. Increasing V dot results in greater $P_{dep}$ and transport becomes diffusion limited as $\lambda$ decreases. The trade-off between using a sufficient carrier gas flow rate and maximizing gas-phase diffusion of organics gives rise to the 0.01 to 10 Torr optimum pressure range used in OVPD.

While Eq.(5) may be used accurately with dilute, non-polar gases like helium and argon, OVPD deals with a mixture of complex molecules, e.g. $Alq_3$, along with the carrier gas, such as nitrogen or argon. The effective nominal mean free path and collision cross-section, $\lambda$ and $\sigma$, can be determined via modified expressions for the diffusivity through Eq. 5 and the relationship:

$$D_{org} = \frac{1}{3} \bar{u} \lambda \quad (6)$$

Here, the Chapman-Enskog expression for the diffusivity of molecules with dipoles or induced-dipoles may be used:

$$D_{AB} = \frac{1.835 \cdot 10^8 \cdot T^{1.5} \left( \frac{1}{M_A} + \frac{1}{M_B} \right)^{0.5}}{P \sigma_{AB}^2 \Omega_{D,AB}} \quad (7)$$

where $M_i$ is the mass of the diffusing species i, T is the gas temperature, and $\sigma_{AB}$ is the average collision cross-section, $\sigma_{AB} = [\frac{1}{2}(\sigma_A + \sigma_B)^2]^{1/2}$. The quantity $\Omega_{D,AB}$ is a dimensionless function of the Lennard-Jones intermolecular potential and temperature. Frequently, for the materials commonly used in OLEDs, reliable Lennard-Jones parameters are not available, and the Fuller correlation may be substituted:

$$D_{AB} = \frac{0.1013 \cdot T^{1.75} \left( \frac{1}{M_A} + \frac{1}{M_B} \right)^{0.5}}{P[(\sum v_A)^{0.5} + (\sum v_B)^{0.5}]^2} \quad (8)$$

where $\Sigma v$ is the summed effective volume contribution of the individual structural components of the diffusing molecule. The various molecule-specific constants have been calculated using standard group contribution methods described elsewhere. As evident from Table 1, the values of $D_{AB}$ vary by half an order of magnitude between the different theories, and it may be necessary to carry out more detailed experiments and/or molecular dynamics simulations to determine the binary diffusivities more accurately. However, approximate values of λ and σ should suffice for determining trends with pressure, which trends may be used to control desired deposition properties.

Simulation

A Monte-Carlo simulation was performed as follows. The computational space is divided into a 3-dimensional grid with variable cell size. Particles representing organic molecules are assigned random initial locations inside the boundary layer and above the mask, and velocities that satisfy the Maxwell-Boltzmann distribution. After an elapsed time interval and a short travel distance no greater than $1/10^{th}$ of the mean free path, the molecule is allowed to collide with a locally generated carrier molecule having a random velocity from a Maxwell-Boltzmann distribution. The acceptance of collision is calculated using following function was used:

$$P_{coll} = \frac{F_N \sigma_T u_r \Delta t}{v_c} \quad (9)$$

where $F_N$ is the number of real molecules represented by one simulated molecule, $\sigma_T$ is the total cross-section of the colliding molecules, $u_r$ is their relative speed, $\Delta t$ is the time interval allowed for the collision to take place, while $V_C$ is the volume of the cell in which the collision occurs. The value of $\sigma_T$ can be calculated from $d_{eff}$, an effective collision diameter which scales with the relative particle velocity, $v_r$:

$$d_{eff} = d_0 \cdot \frac{v_r}{v_{r0}} \quad (10)$$

The whole process is repeated, while the mega-molecules are tracked in space. Upon collision with the substrate plane or any side of the mask, the organic particles are immobilized there. Periodic boundary conditions are imposed laterally, while a constant concentration of organics and carrier gas is set at the edge of the boundary layer. The simulation runs until a desired film thickness has been formed on the substrate. Tracking mega-molecules consisting of several individual molecules is done to save computational costs.

Simulation Results and Discussion

Figure 5A:
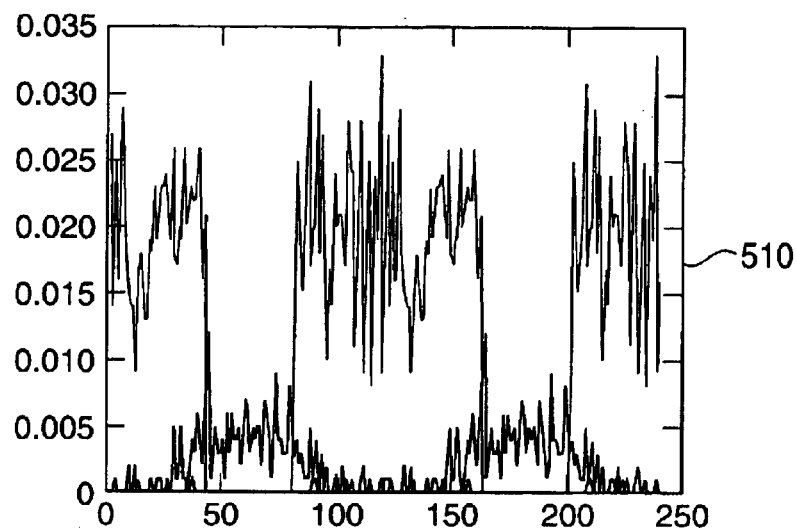
FIG. 5 shows simulated results for deposition through a shadow mask, showing the effect of varying deposition pressure.
Figure 5B:
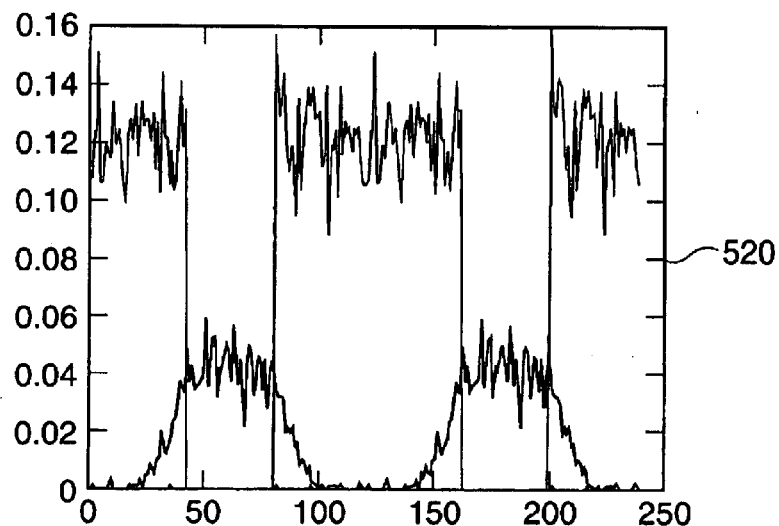
Figure 5C:
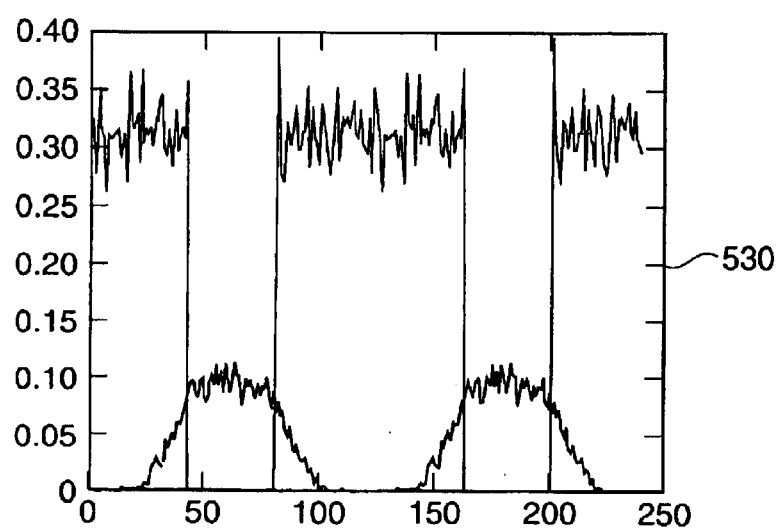

FIG. 5 shows simulated results for deposition through a shadow mask in the diffusive regime. For a nominal s=10 μm and mask thickness of 18 μm, the deposition patterns for λ=8.25, 82.5, and 825 μm ($P_{dep}$≈0.01, 0.1, 1.0 Torr) are shown in FIG. 5. Molecules were launched from 2000 μm away from the mask at random angles having average molecular thermal velocities and allowed to diffuse throughout the simulated space volume. The concentration profile in the vicinity of the substrate was found to be linear, indicating that transport is purely diffusive. This is why, in FIG. 5, no difference in d is observed for different values of λ. Also in agreement with the continuum model, the fraction of molecules, which deposit on the substrate and the mask, i.e. the deposition efficiency, is lower for small λ, which correspond to small $D_{org}$. The simulation was performed with 30 μm wide mask openings, a mask thickness of 18 μm, and a mask separation, s=10 μm. Plots 510, 520 and 520 show deposition thickness profiles for the mask (higher) and the substrate (lower) for λ=8.25, 82.5, 825 with $P_{dep}$=1.0, 0.1, 0.01 Torr. There is no noticeable difference in the pixel shape between pots 510, 520 and 530, indicating that in the purely diffusive regime pressure has little effect on edge dispersion; the efficiency of deposition, as expected, drops for lower values of λ.

Figure 6A:
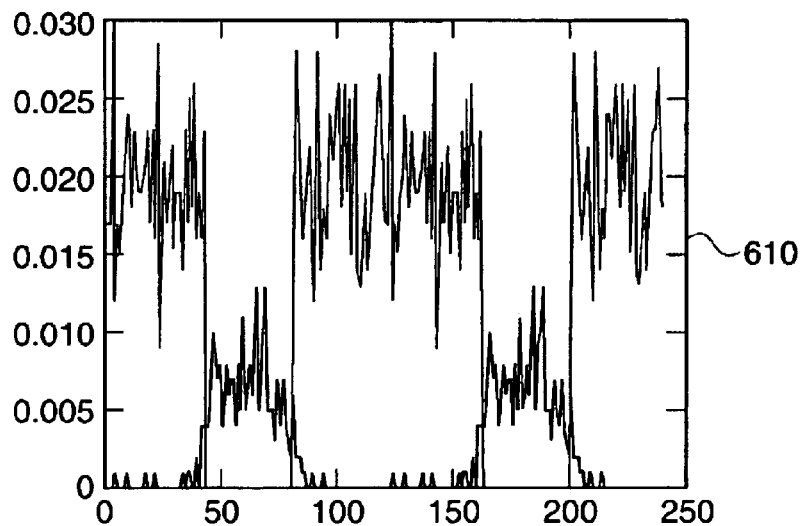
FIG. 6 shows simulated results for deposition through a shadow mask, showing the effect of varying the separation between mask and substrate.
Figure 6B:
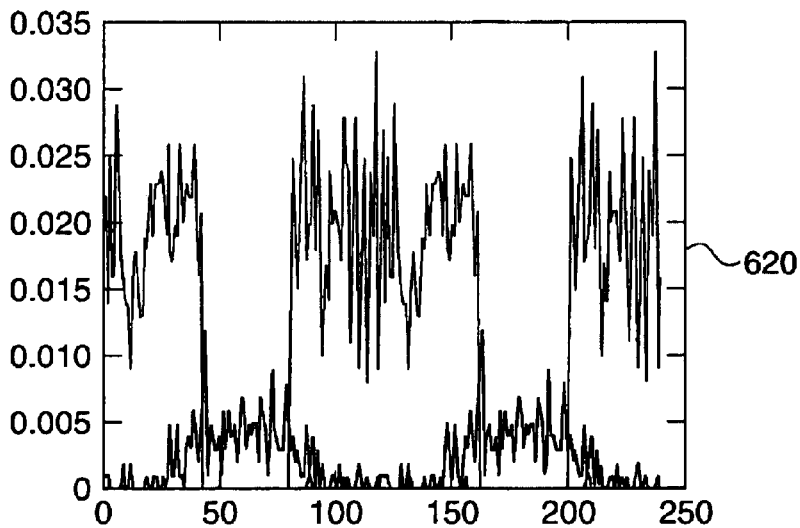
Figure 6C:
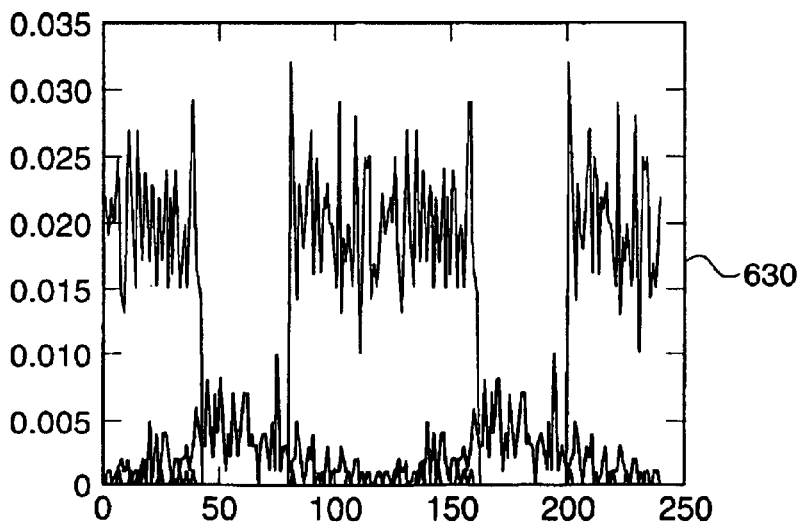

FIG. 6 shows simulated results for deposition through a shadow mask in the diffusive regime. The mask openings remain 30 μm wide, with t=18 μm and λ=82.5 μm, while s=3, 10, 20 μm, respectively, for plots 610, 620 and 630. Smaller values of s result in sharper pixels. As long as s~λ, trapezoidal pixel shapes may be obtained, similar to vacuum deposition. Pixel overlap starts to occur when s~t. Keeping the purely diffusive framework for the simulation, FIG. 6 shows how variation in s affects pixel edge dispersion. Since λ does not affect d in this regime, we use λ=82.5 μm; for t=18 μm pixel cross-talk starts to occur when s=20 μm, i.e. as s approaches t, there is overlap of the neighboring pixels.

Figure 7A:
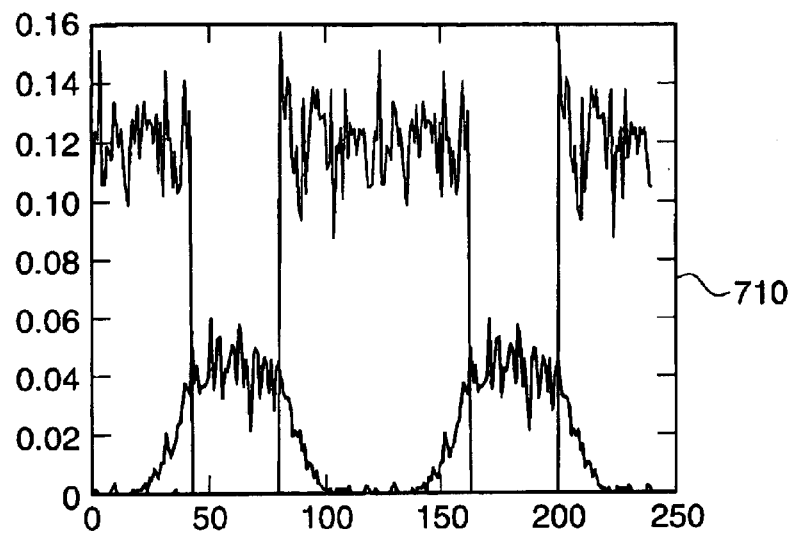
FIG. 7 shows simulated results for deposition through a shadow mask, showing the effect of varying mask thickness.
Figure 7B:
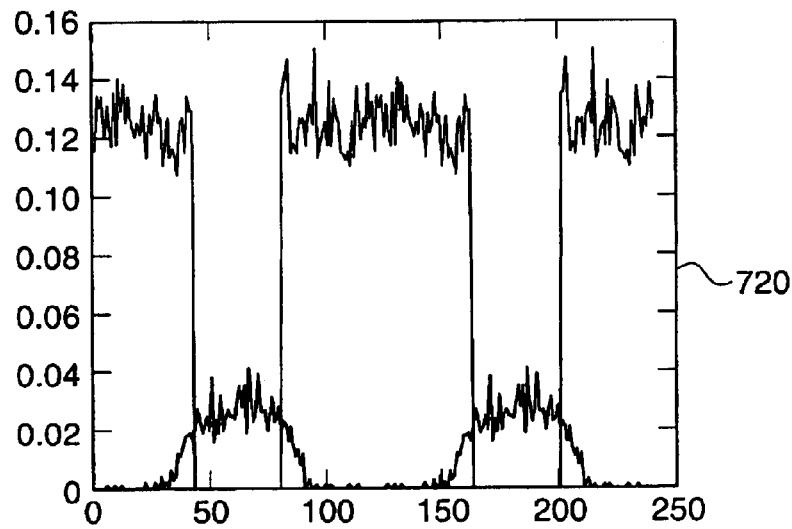
Figure 7C:
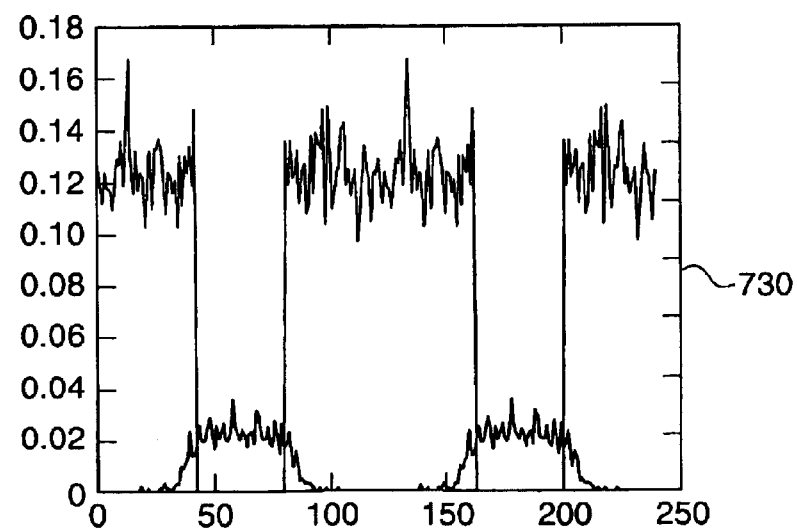

FIG. 7 shows simulated results for deposition through a shadow mask in the diffusive regime. The mask openings remain 30 μm wide, with λ=82.5 μm and s=10 μm. Here, mask thickness, t, is varied to 18, 36, and 54 ~m, respectively, for plots 710, 720 and 730. Thicker masks result in sharper pixels, albeit at the expense of cutting off material flux to the substrate and reducing deposition efficiency, as can be seen by the low mask-to-substrate deposition ratio. As t approaches λ, the collimated molecular flux results in trapezoidal pixels, similar to vacuum deposition. The dome-shaped profiles become increasingly like the vacuum-thermal deposited trapezoids as t approaches λ.

Figure 8A:
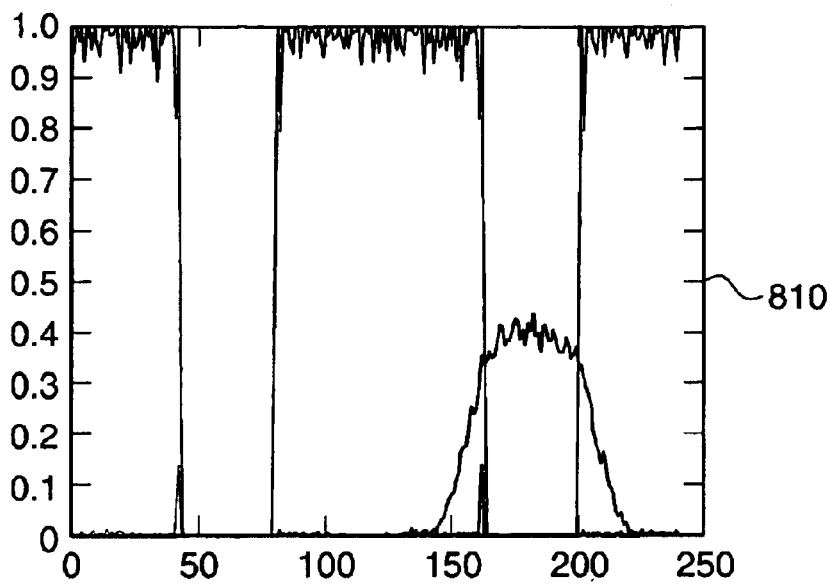
FIG. 8 shows simulated results for deposition through a shadow mask, showing the effect of varying the effective boundary layer thickness.
Figure 8B:
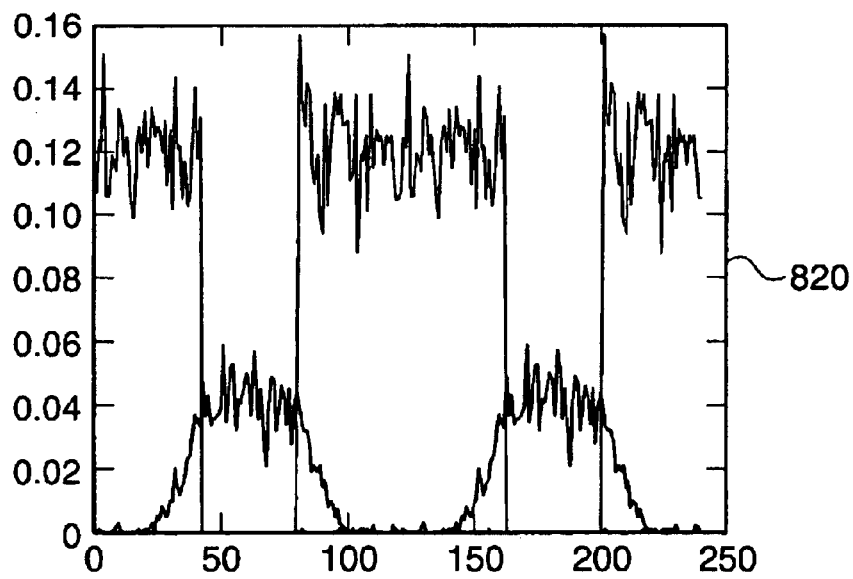

FIG. 8 shows simulated results for deposition through a shadow mask in the diffusive regime. The mask openings are 30 μm wide, with λ=82.5 μm and s=10 μm. Plots 810 and 820 show results for δ=410 and δ=2060 μm, respectively. Here, the effective boundary layer thickness is decreased from 2060 to 410 to 80 μm by adjusting the launching point to be closer to the substrate. As δ approaches λ, the deposition efficiency increases, in agreement with the continuum model for diffusion-limited transport to the substrate. Here, the effective δ was varied by launching the molecules closer to the substrate.

Changing the mass of the carrier gas in the purely diffusive deposition regime was found to have no first order effect on the deposition profile, as expected from the discussion of the previous sections.

Figure 9:
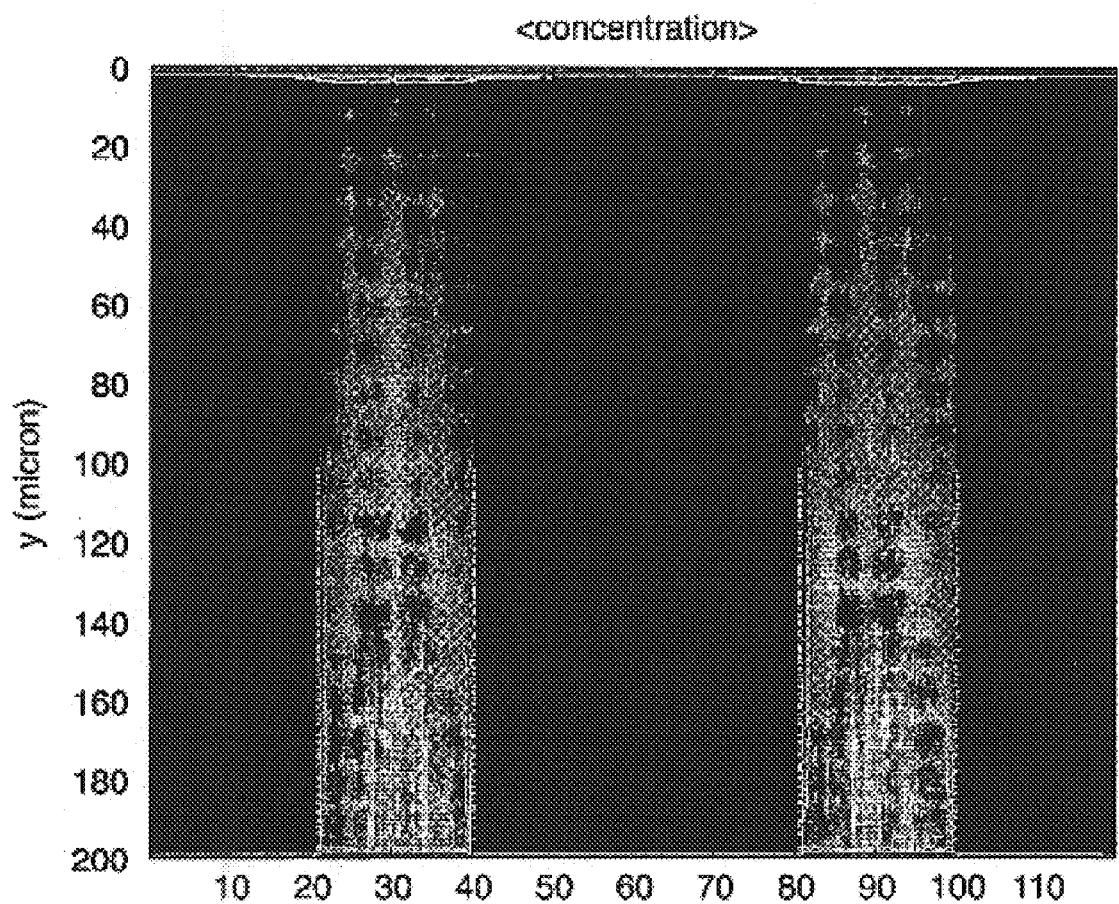
FIGS. 9 and 10 show simulated results for deposition through a shadow mask with a carrier gas bulk flow velocity.

If the molecules are allowed to keep their original bulk flow velocity as they enter and propagate through the BL, the deposition profiles become sharper. They approach the trapezoidal shape characteristic of vacuum deposition when the bulk flow velocity, $U_{bulk}$, approaches the molecular thermal velocity, $\bar{u}$. This suggests a mode of deposition where organics are "sprayed" onto the substrate using an ultra-fast jet of carrier gas, similar to ink-jet printing. An example of this vapor-jet deposition mode is illustrated in FIG. 9, which shows a concentration map where the bulk velocity is superposed on the random thermal motion of the molecules, resulting in a jet-like molecular flux through the mask aperture.

Figure 10:
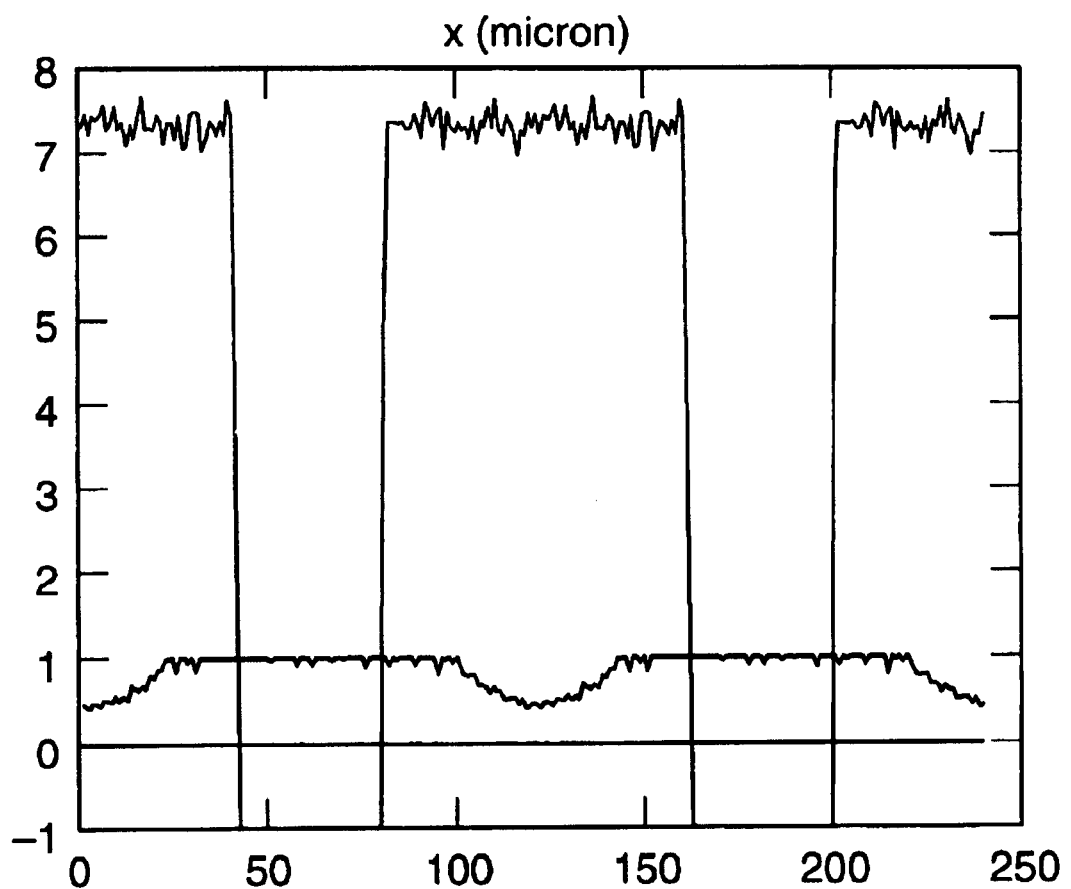

FIG. 10 shows a material concentration map which shows the jet-like character of deposition with ultra-fast carrier flow. The overall deposition efficiency of this process may approach 100%, since pixels are patterned by the directed gas jets and no material is wasted in coating the shadow mask. It should be possible to engineer a deposition system with individual nozzles for each color pixel for efficient, precise, and more portable deposition systems. The deposition profile of FIG. 10 shows a well-defined, trapezoid-shaped pixel, similar to the vacuum deposition case.

Experimental

The deposition of organic thin films of $Alq_3$ was carried out using a multi-barrel glass reactor system with in situ temperature and thickness measurement capability. Briefly, the reactor vessel is an 11 cm diameter by 150 cm long Pyrex® cylinder. It is heated by means of a three-zone furnace enabling source temperature control via positioning of each cell along the temperature gradient within the tube. Each source is separately encased in a 2.5 cm diameter by 75 cm long glass barrel. Carrier gas flow is regulated by mass flow controllers, while the deposition pressure is kept between 0.1 and 10 Torr by adjusting the pump throttle valve and the total carrier flow rate from 10 to 50 sccm. A 40 lpm vacuum pump with a liquid nitrogen cold trap is used to exhaust uncondensed carrier and organics. Organic vapors condense onto a rotating water-cooled substrate positioned behind a mechanically operated shutter. Film thickness and growth rate are monitored by a quartz crystal microbalance calibrated using the ellipsometrically measured organic film thickness.

In addition to deposition of organic thin films using OVPD, a conventional vacuum thermal evaporator was used. The source-to-substrate distance was approximately 30 cm; the deposition pressure was maintained at $10^{-6}$ Torr.

Figure 11:
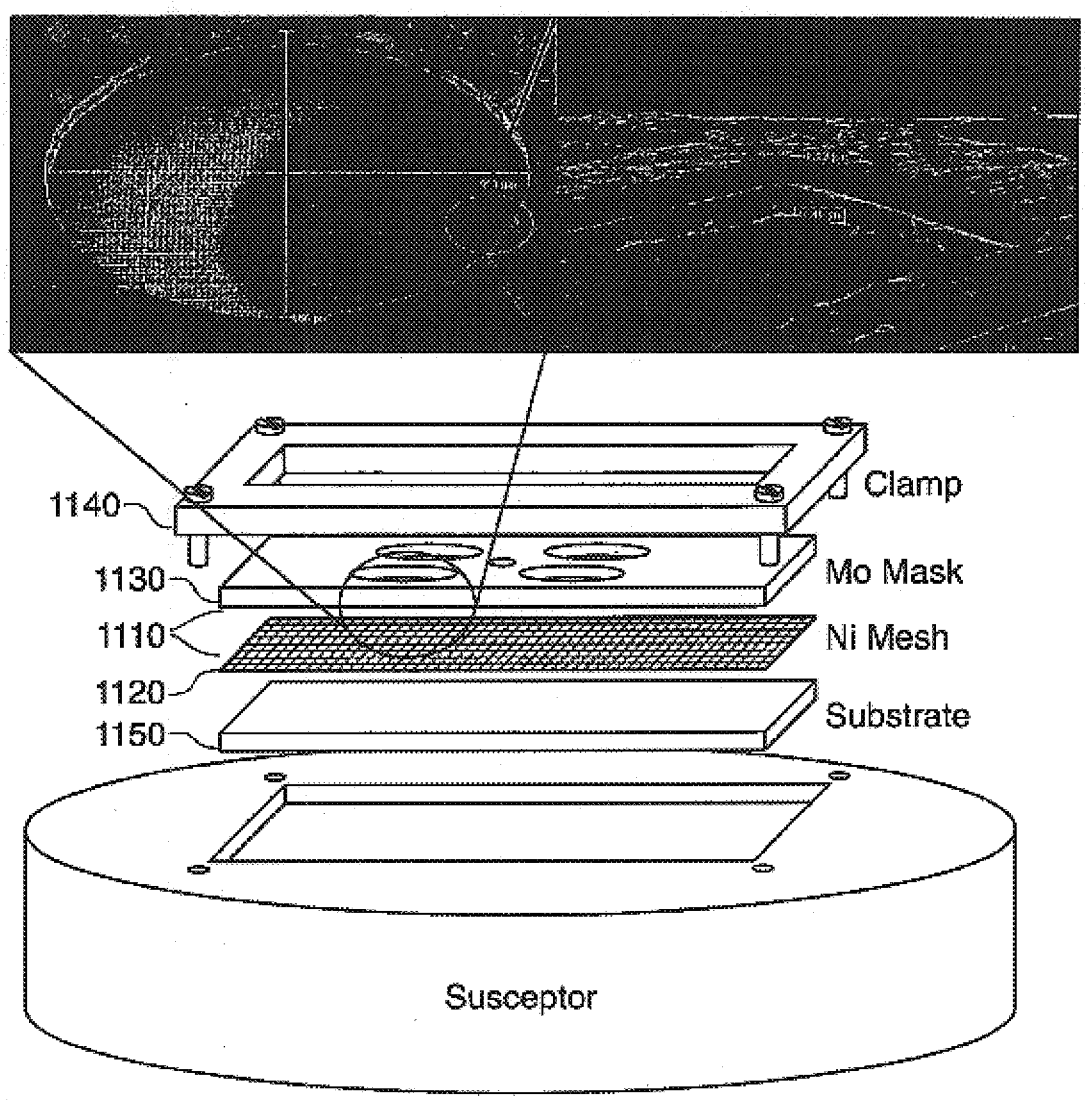
FIG. 11 shows a general schematic of the substrate-shadow mask assembly used in an experiment. The insets show scanning electron micrographs that detail the top mask and the nickel mesh which was placed directly onto the substrate.

The shadow-masking arrangements are illustrated in FIG. 11. A mask 1110 comprising a mesh 1120 and a plate 1130 having holes was used. A clamp 1140 was used to hold mask 1110 a fixed distance above a substrate 1150. Mesh 1120 comprised a 5 $\mu$m thick nickel mesh consisting of 10 $\mu$m lines that interlace, forming 15 $\mu$m square openings. This mesh was placed directly on top of 1 mm thick silver-coated glass slides and covered with a 50 $\mu$m thick nickel plate 1130 containing round holes 1 and 0.3 mm in diameter. This arrangement allows for the simultaneous measurement of deposition for two values of s. Due to the non-square profile of the metal wires comprising the nickel mesh, as shown in FIG. 11, the smallest value of s is ~2 $\mu$m. Here, the dispersion values, d, for s=2 $\mu$m will refer to the fuzziness of the square pixels 7–10 $\mu$m on the side. Values of d corresponding to s=5 $\mu$m refer to the fuzziness of the circular deposition edge formed with the 1 mm and 0.3 mm holes of the 50 $\mu$m thick mask resting on top of the mesh. The next largest separation of 50 $\mu$m was achieved with a two-layer nickel mask illustrated in FIG. 11.

Additional shadow masks were fabricated integral to the substrate to provide the most accurate mask-substrate separations. The masks were formed using a photoresist/chromium/photoresist (PR1/Cr/PR2) sandwich structure and photolithography.

Following the deposition of $Alq_3$, the resulting pixel patterns were examined using scanning electron microscopy.

Experimental Results and Discussion

Figure 12:
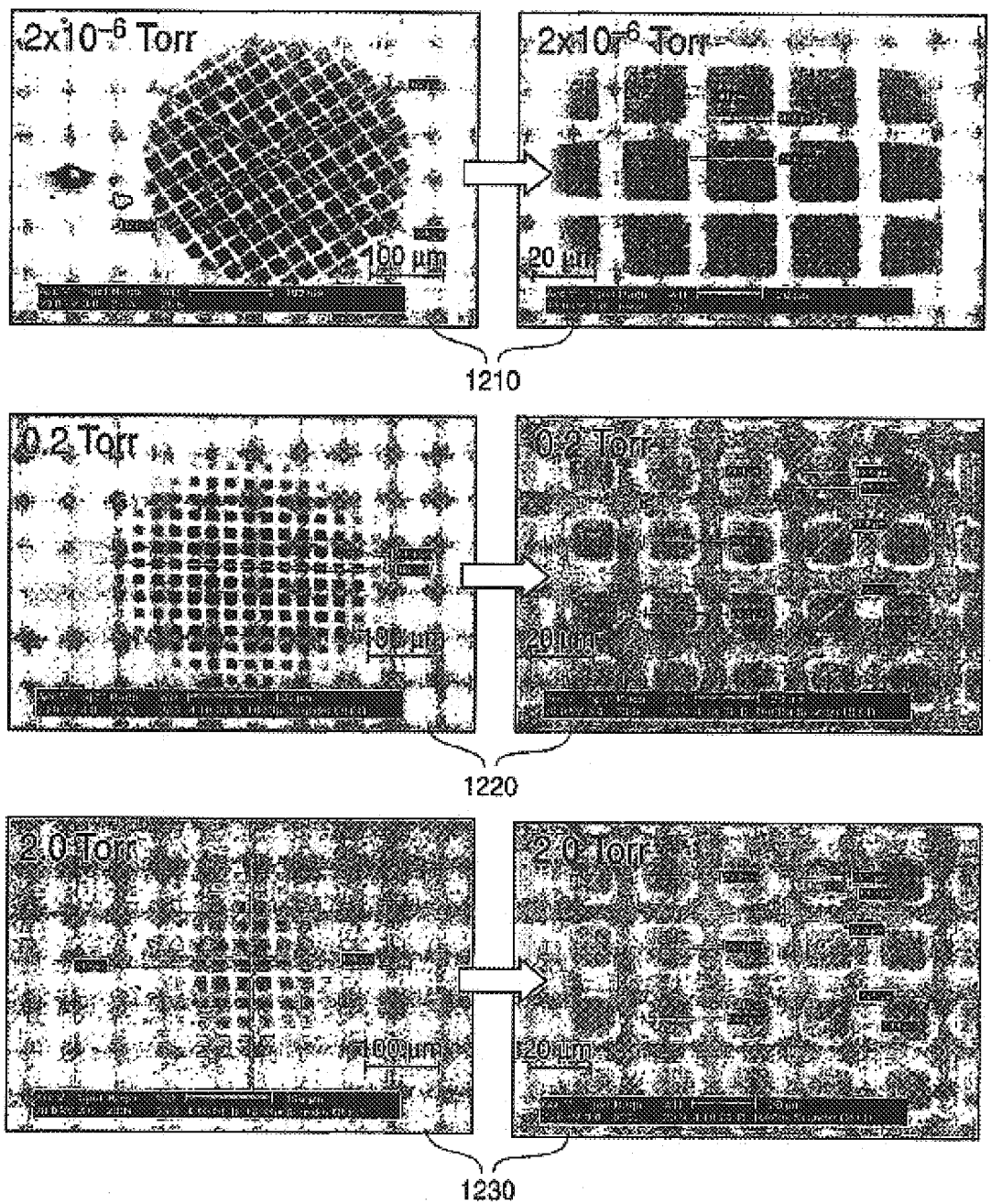
FIG. 12 shows scanning electron micrographs of some representative $Alq_3$ patterns formed on silver-coated glass substrates after deposition through shadow masks.

FIG. 12 shows scanning electron micrographs of the patterns resulting from OVPD through a shadow-mask at $P_{dep}$ ranging from $2 \times 10^{-6}$ to 2 Torr. As the deposition pressure increases, both simulations and experimental data indicate the loss of edge sharpness. Images 1210, 1220 and 1230 show results for $P_{dep}=2\cdot 10^{-6}$, $P_{dep}=0.2$ Torr, and $P_{dep}=2$ Torr, respectively. The separation s=5 and 2.5 $\mu$m for the left and right column respectively. As predicted by the model, the pixels become more diffuse as pressure and mask-substrate separation increase. It was found that at pressures of 0.2 Torr and separation of up to 15 $\mu$m it is possible to achieve a pixel resolution on the order of several microns, which is sufficient for full color display applications.

To quantify the extent of pixel fuzziness, we define a dispersion parameter, d, to be the distance along the x-direction where the pixel thickness is between 90 and 10% of its maximum at the center. This number is scaled by the mask-substrate separation, s, to yield a dimensionless pixel dispersion which is plotted versus the deposition pressure for both experiment and simulation.

Hybrid Deposition

Figure 13:
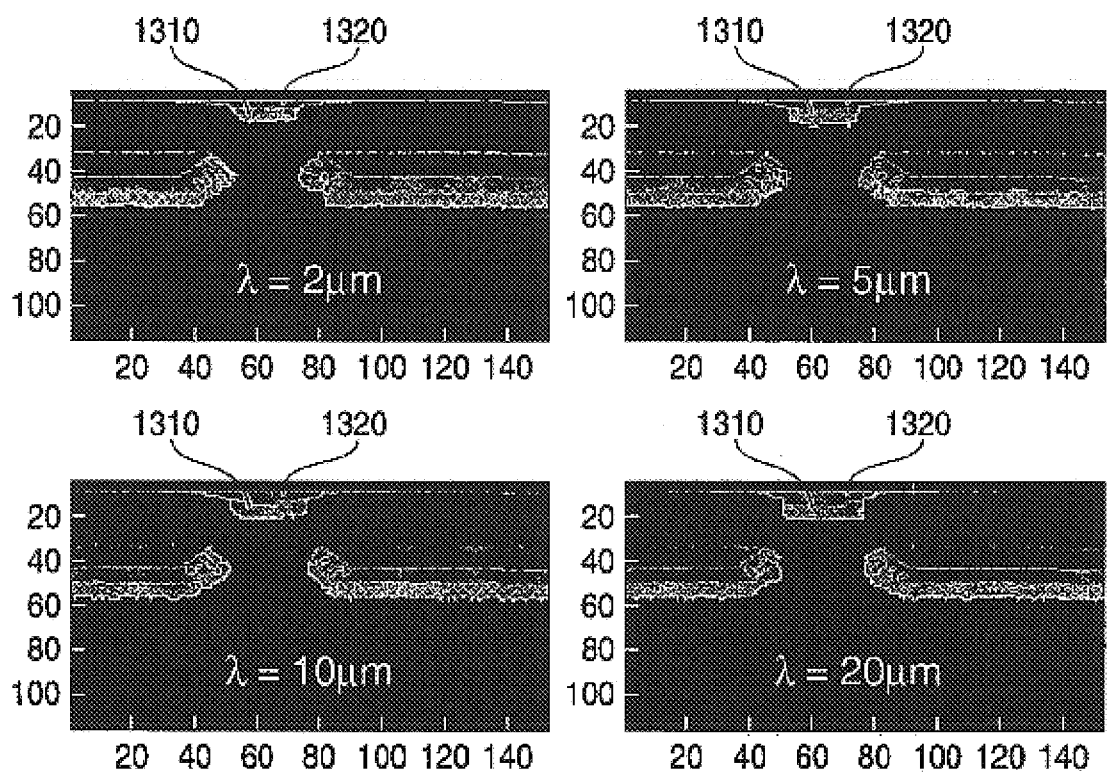
FIG. 13 shows simulation results for $Alq_3$/Ag micropatterns formed by hybrid OVPD-VTE deposition, where the same shadow mask was used for both.

FIG. 13 shows the results of a simulation for an $Alq_3$/Ag micropatterns formed by hybrid OVPD-VTE deposition, where the same shadow mask was used for both. Excellent alignment of metal layers 1310 with underlying organic layers 1320 is guaranteed automatically, while the spread of the organic prevents potential shorts around the pixel edge. The simulation results show an increase in dispersion with pressure similar to that of the experiment at the pressure range accessible in OVPD. While pressures between $10^{-6}$ and $10^{-1}$ Torr are not readily accessible with the current deposition system, the simulation results can fill in the gap. In the limit of very low deposition pressure, pixel edge dispersion may asymptote to a non-zero constant, characteristic of the vacuum chamber and mask geometry.

When fabricating a full-color OLED display, the various layers of patterned material are preferably aligned to one another. One practical scheme involves a combination of OVPD through a shadow-mask at moderate pressure, as shown in FIG. 4, followed by the deposition of a metal contact at low pressure, as indicated in FIG. 2, without moving the mask between the steps. The controlled dispersion of the organic coating will prevent formation of electrical shorts around the edge of the organic film. This concept is illustrated by the simulation illustrated in FIG. 13.

Figure 14:
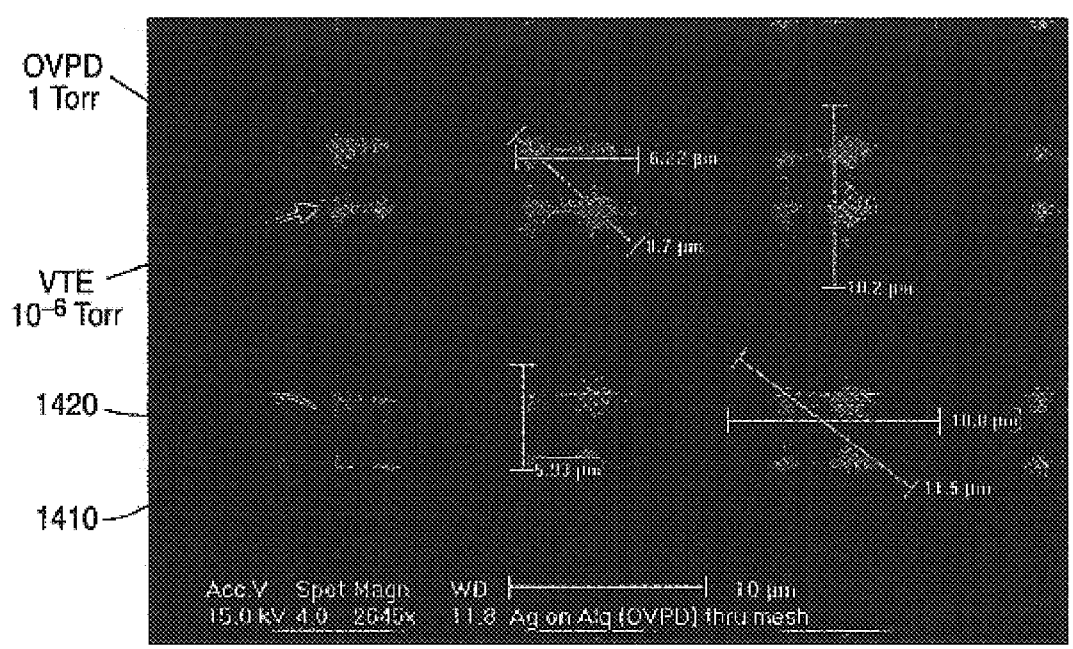
FIG. 14 shows a scanning electron micrograph of experimental results for $Alq_3$/Ag micropatterns formed by hybrid OVPD-VTE deposition, where the same shadow mask was used for both.

FIG. 14 shows a scanning electron micrograph of a structure experimentally fabricated in accordance with the simulation of FIG. 13. An $Alq_3$ organic layer 1410 was deposited by OVPD, followed by an Ag metal layer 1420 deposited by VTE. Because of the different parameters used when the layers were deposited, the organic layer was consistently and reliably larger than the metal layer, even though they were deposited through the same shadow mask, which remained immobile in the same position through both deposition of the organic and the metal. A second set of pixels may be deposited by simply translating the mask laterally (perhaps in-situ), without the need for alignment of a mask to the previously deposited pattern, and then depositing a second organic layer (perhaps that emits a different color), followed by a metal layer. The process may be repeated once again for a three color display.

TABLE 1

Gas phase diffusivity coefficients for $Alq_3$, $N_2$, and $Alq_3$ in $N_2$ mixture.

| T (K) | $D_{org}$ (Kinetic Theory) ($cm^2/s$) | $D_{org}$ (Fuller et al.) ($cm^2/s$) | | $D_{org}$ (Chapman-Enskog) ($cm^2/s$) |
|---|---|---|---|---|
| 273 | 0.0355 ($N_2$) | 0.68 ($N_2$) | 0.105 ($Alq_3$) | 0.0629 ($N_2$) |
| 548 | 0.101 ($N_2$) | 2.30 ($N_2$) | 0.356 ($Alq_3$) | 0.179 ($N_2$) |

Additional Simulations

Although a continuum-based analysis may not be rigorously accurate for the transport regime encountered in OVPD, some insight into the patterning by OVPD can be gained by considering simple diffusion in confined geometries.

Figure 15:
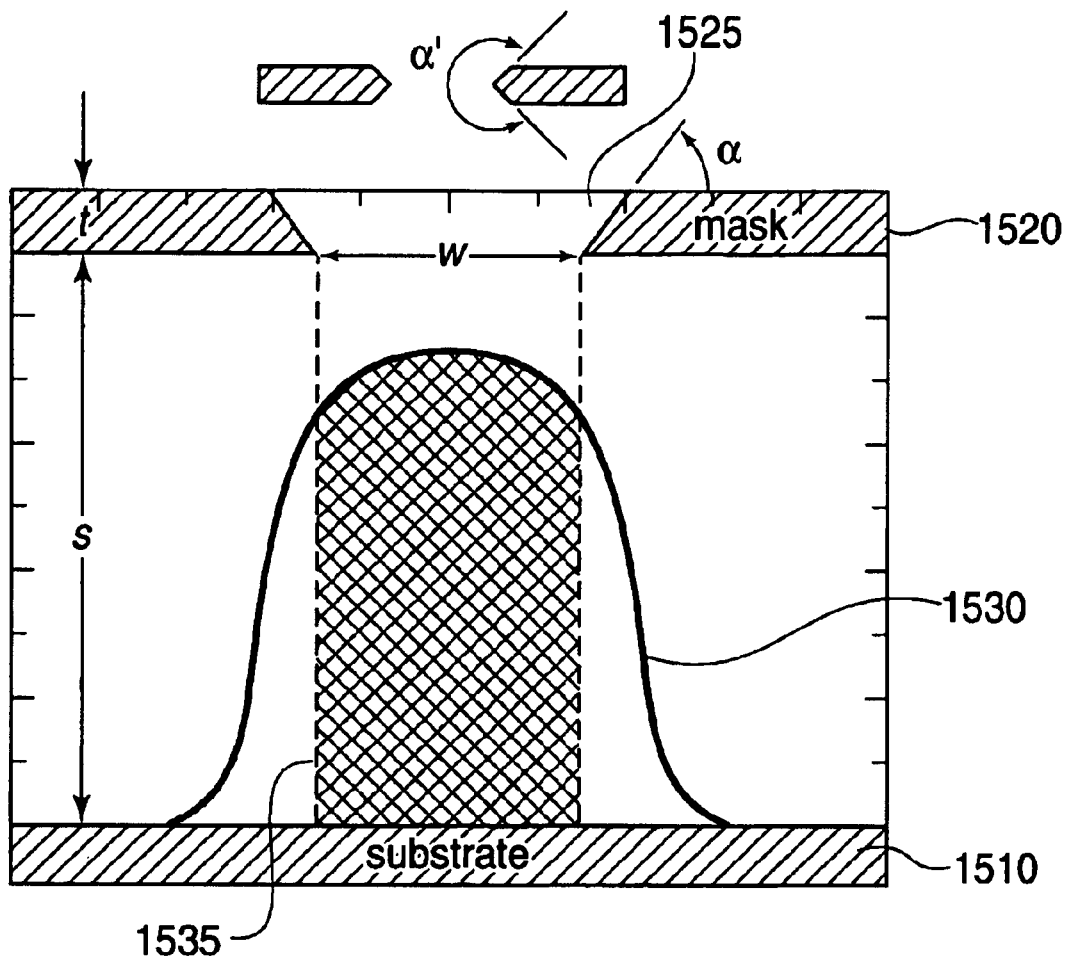
FIG. 15 illustrates a bell-shaped profile of a pixel deposited by OVPD through a shadow-mask.

FIG. 15 illustrates a bell-shaped profile of a pixel deposited by OVPD through a shadow-mask. A substrate 1510 is disposed underneath a mask 1520. The aperture wall profile is characterized by an angle α (or α'). Mask 1520 has a thickness t and an aperture 1525 of width w is separated from the substrate by s. A layer 1530 of material is deposited through mask 1520 onto substrate 1510. The molecular flux incident on the substrate originates from an infinite number of uniformly distributed point sources in the space bound by $-w/2<x<w/2$, resulting in the deposit having the bell-shaped profile shown. For isotropic diffusion in the continuum regime, the base of the deposit will widen in direct proportion to s. Thus, smaller s should result in greater pattern resolution. If s is kept constant, but the deposition pressure increases, the diffusivity of the gas molecules drops. However, since diffusion is isotropic, the longer it takes for a molecule to diffuse perpendicularly to the substrate, the longer it will take (by the same amount) for it to diffuse laterally. The mutual cancellation of these rates will result in identical patterns at different pressures, which is not the observed experimental trend. Moreover, in the continuum assumption, the pattern formation does not depend on the shape of the aperture above the edge closest to the substrate. In contrast, a simulation of the deposition, which looks at the stochastic scattering of molecules in the vicinity of the substrate, is able to predict that the deposited pattern shape depends not only on s, but also on mfp and the aperture shape.

Due to the discrete nature of transport at low number densities, several collimating effects on the organic molecule flux through the mask aperture must also be considered. Firstly, molecular flux collimation may be proportional to the aspect ratio, t/w, of the aperture (at the expense of deposition efficiency). Secondly, some collimation may occur if the heavy organic molecules retain a significant fraction of their initial bulk flow velocity, U, when they arrive at the mask plane, provided $\bar{u}<U$ (we assume fully developed flow in the deposition chamber, so that at the edge of the boundary layer, U for organic molecules is assumed to be equal to U for the carrier gas molecules). In the OVPD regimes considered here, bulk flow may not significantly contribute to flux collimation, since $\bar{u}$~100–400 m/s, while U~1–10 m/s, and hence pure diffusion dominates near the substrate. However, the effects of the bulk flow momentum of the carrier gas can still be investigated using Monte-Carlo simulations. For example, it may be that, if $U/\bar{u}>0.1$, changes in U can affect the deposit profile. Finally, since natural convection rate is insignificant compared to diffusion at low number densities, the thermal driving force in the vicinity of the substrate is estimated to be relatively small and is not further considered.

The discussion of pattern shape is aided by defining a shape factor, η, equal to an area 1535 of layer 1530, which is bound by $-w/2<x<w/2$ (cross-hatched region) divided by the total deposit cross-sectional area. Then η is equal to unity for a "perfect", rectangular deposit and decreases with increasing P, t/w, s.

One objective of the simulation is to understand how organic molecules are transported in confined geometries, where the apparatus dimensions are on the order of the mean free path of the molecules, and continuum-based descriptions do not apply. The model addresses the patterning of the organic deposit on the substrate with the added constraint of condensation on the surfaces of aperture with a finite thickness. The simulation represents the stochastic nature of the diffusion process at the intermediate Kn. Therefore, the model traces the paths of organic molecules in the vicinity of the substrate as they collide with the lighter carrier gas molecules and deposit on cooled surfaces—the substrate and the aperture edges. For simplicity the sticking probability is assumed to be unity. Using a preferred vapor pressure of the organics of about $10^{-2}$ Pa, and a preferred background carrier gas pressure on the order of 1 to $10^3$ Pa, organic-organic collisions are rare.

Bulk diffusive transport of gases is a mean free path phenomenon, whose rate is characterized by the diffusivity, D. Kinetic theory of simple gases correlates the bulk parameter D with the molecular based quantity, the mean free path, mfp:

$$D = \frac{1}{3}\bar{u} \cdot mfp \tag{11}$$

for a single-component, low-pressure non-polar gas at low pressure mfp. Since the organic vapors used in OVPD consist of large molecules, geometrically and energetically more complex than the hard sphere atoms of kinetic theory, there may be some differences between the simulation and experimental results.

The Monte-Carlo simulation proceeds as follows. The computational space is divided into an x-z grid extending infinitely in the y-direction, whose purpose is to locate the substrate and mask surfaces, and track changes in the thickness of deposits. A particle representing an organic molecule is assigned a random initial location $(x_0, y_0, z_0)$ inside the boundary layer and above the mask. A random initial direction is chosen and the particle travels a distance $r=[(x_1-x_0)+(y_1-y_0)+(z_1-z_0)]^{1/2}$, where $(x_1, y_1, z_1)$ is the particle's new location. The distance r is a minimum of the grid size or the mfp/10. The probability of collision, $P_{coll}$, with a carrier gas molecule is given by $P_{coll}=r/mfp$, which is checked against a random number, rand, between 0 and 1. If $P_{coll}<rand$, the molecule is again allowed to proceed in the same direction for a distance r. If $P_{coll}>rand$, the particle collides with a locally generated carrier gas molecule having a velocity chosen randomly from a Maxwell-Boltzmann distribution. The collision causes the molecule to be deflected with a velocity and an angle consistent with momentum and energy conservation in an elastic collision of two hard spheres. If the path of the particle crosses the substrate plane or the aperture wall, the particle is assumed to stick to the surface with unity efficiency, while the thickness of the deposit is updated. A single aperture is simulated, with periodic boundary conditions imposed in the x-direction. The simulation run-time increases with the number of molecules used for the deposition run and decreases for larger mfp. Effects of aperture geometry on deposited pattern formation were modeled by assigning different aperture side-wall angle, $\alpha$=45, 90, 135°, and $\alpha'$=270°, as illustrated in FIG. 15.

We consider the growth of films of the archetypal molecule, tris(8-hydroxyquinoline) ($Alq_3$), having d~10 Å. The collision cross-section for a mixture of $Alq_3$ in a $N_2$ carrier gas is taken as an average of the respective cross-section of the two species in self-diffusion, $d=\frac{1}{2}(d_{Alq3}+d_{N2})$, while $P=P_{dep}$ in Eq. (1).

Figure 16:
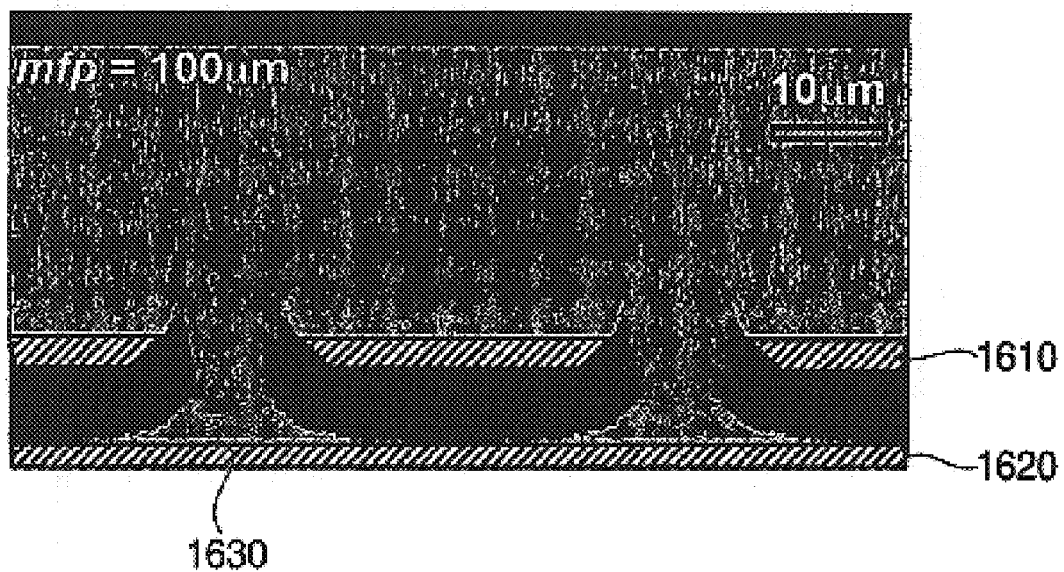
FIG. 16 shows simulated deposition results obtained from a Monte-Carlo simulation using $10^5$ particles, mfp=100 $\mu$m, s=7 $\mu$m, t=3 $\mu$m, and $\alpha$=135°.

FIG. 16 shows a simulated profile of the organic species concentration at the end of a simulation run of $10^5$ particles, with s=7 $\mu$m, t=3 $\mu$m, and $\alpha$=135°, and mfp=100 $\mu$m, corresponding to a total deposition pressure of ~37 Pa at T=500K. Organic layer 1630 (simulated) was deposited on substrate 1620 through mask 1610, which is disposed a distance s above mask 1610. The initial particle velocities were assigned from a random thermal distribution and superimposed onto a z-directed velocity vector with a magnitude of U=10 m/s. The size of the individual particle was enlarged to show the deposited film thickness profile.

Figure 17:
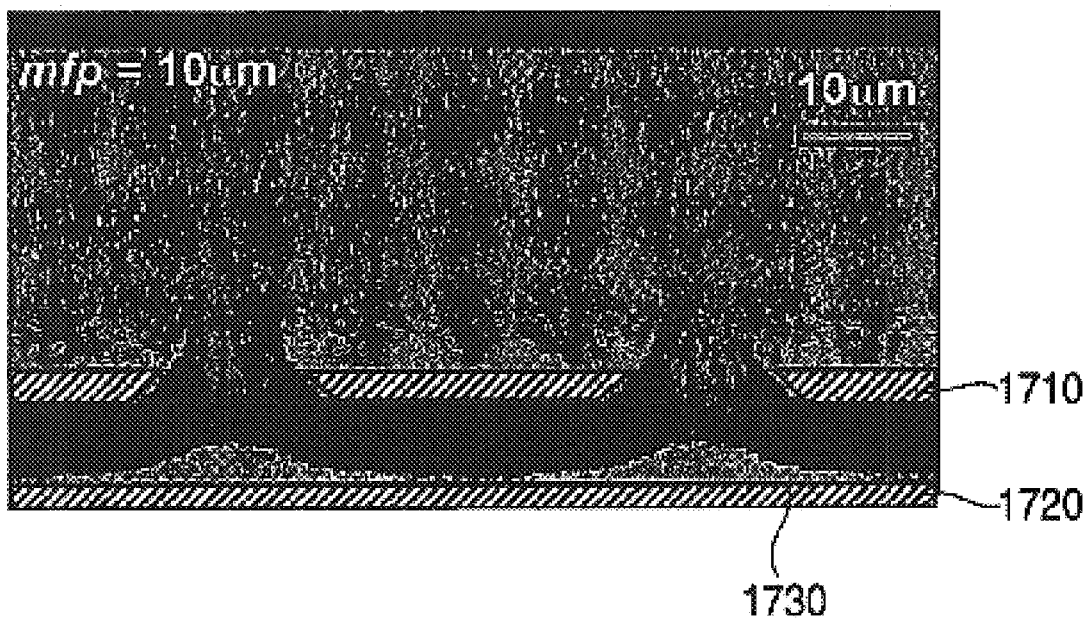
FIG. 17 shows a simulated deposition results obtained from a Monte-Carlo simulation using $10^5$ particles, mfp=10 $\mu$m, s=7 $\mu$m, t=3 $\mu$m, and $\alpha$=135°.

FIG. 17 shows a simulated profile similar to that of FIG. 16, where an organic layer 1730 (simulated) was deposited on substrate 1720 through mask 1710, which is disposed a distance s above mask 1710. The mfp used to generate the results of FIG. 17 is a factor of 10 less than that used for FIG. 16. By decreasing the mfp by a factor of 10, a more diffuse pattern is obtained. The films shown in FIG. 17 may be unrealistically thick with respect to most device applications, but figure nevertheless illustrates the increased parasitic deposition on the inner side of the mask and aperture walls when mfp is reduced. A film thickness on the order of 1000 Å is more practical, and subsequent simulation results will provide only the thickness profile, without the shadow mask superimposed for clarity.

Figure 18:
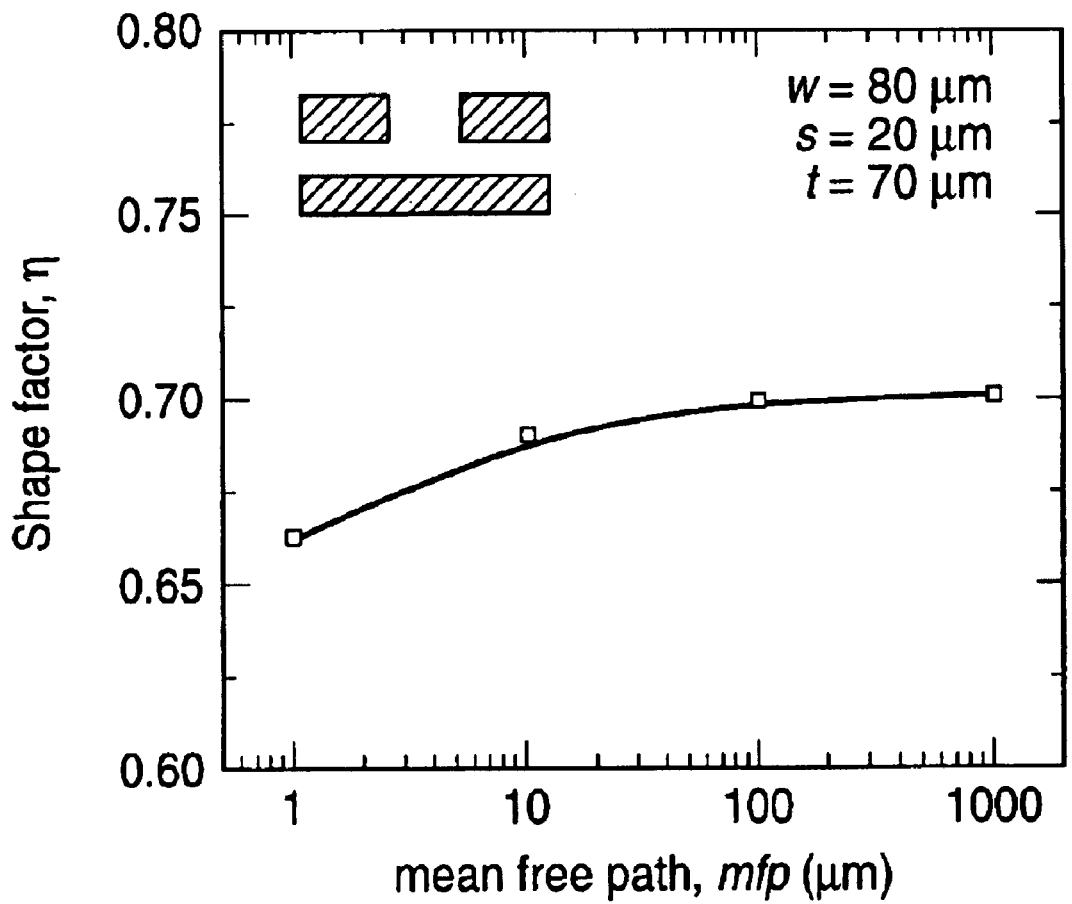
FIG. 18 shows pixel shape factor, $\eta$, as a function of mfp.

The following OVPD simulations used $10^6$ $Alq_3$ molecules in a $N_2$ carrier gas, unless otherwise stated. The effects of deposition pressure on pattern resolution were investigated by varying the mfp, proportional to the reactor pressure. Growth through an aperture with w=80 $\mu$m, t=70 $\mu$m and with the substrate separated from the lower mask edge by s=20 $\mu$m was considered. The choices for s and t are consistent with deposition of high resolution display picture elements (pixels) by VTE, where the substrate facing downward evaporation geometry causes the mask to bow away from the substrate under gravity, leading to s~20 $\mu$m. To stiffen the mask and minimize s, usually t>70 $\mu$m is used. FIG. 18 shows a plot of shape factor v. mean free path. The shape factor, $\eta$, increases only weakly as mfp increases over four orders of magnitude (1 $\mu$m$\leq$mfp$\leq$1000 $\mu$m, corresponding approximately to $10^3$ Pa$\leq P_{dep} \leq$1 Pa), as would be expected for a system approaching the Knudsen transport regime. However, $\eta$ does not reach unity due to parasitic deposition on the sidewalls of the almost square aperture. As expected, the highest pattern edge resolution is achieved for the largest mfp, i.e. the lowest $P_{dep}$. However, the pattern profile exhibits a dome-like shape due to relatively large t/w ratio.

Figure 19:
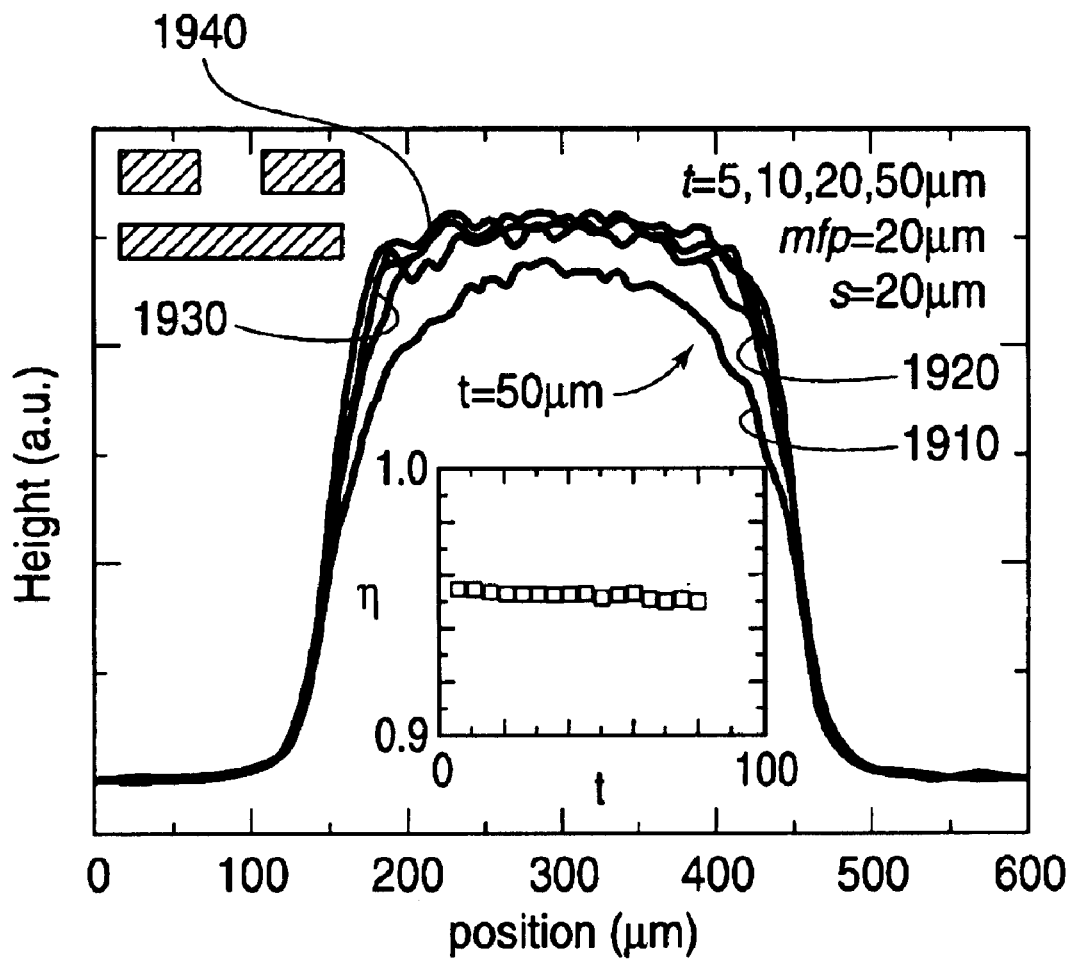
FIG. 19 shows simulated deposited results obtained from a Monte-Carlo simulation using $10^6$ $Alq_3$ molecules in a background of $N_2$ with mfp=20 $\mu$m, illustrating the effect of varying mask thickness. The inset shows shape factor as a function of mask thickness.

FIG. 19 shows profiles of simulated organic layers similar to layer 1630 of FIG. 16, but generated with different parameters. Increasing the aperture thickness can improve collimation of the molecular flux toward the substrate due to the condensation on the walls of the aperture. Plots 1910, 1920, 1930 and 1940 show profiles for an aperture thickness of 50, 20, 10 and 5 $\mu$m, respectively, for s=mfp=20 $\mu$m. w=300 $\mu$m should have no effect on spreading at the edges of the profiles. However, as t/w increases, the deposited pattern becomes significantly more domed due to the scavenging of the organic molecules by the upper edges of the aperture. The shape factor decreases less than 5% over 1 $\mu$m <t <100 $\mu$m range. The pixel deposition efficiency decreases with increasing t due to parasitic deposition on the aperture sidewall.

Figure 20:
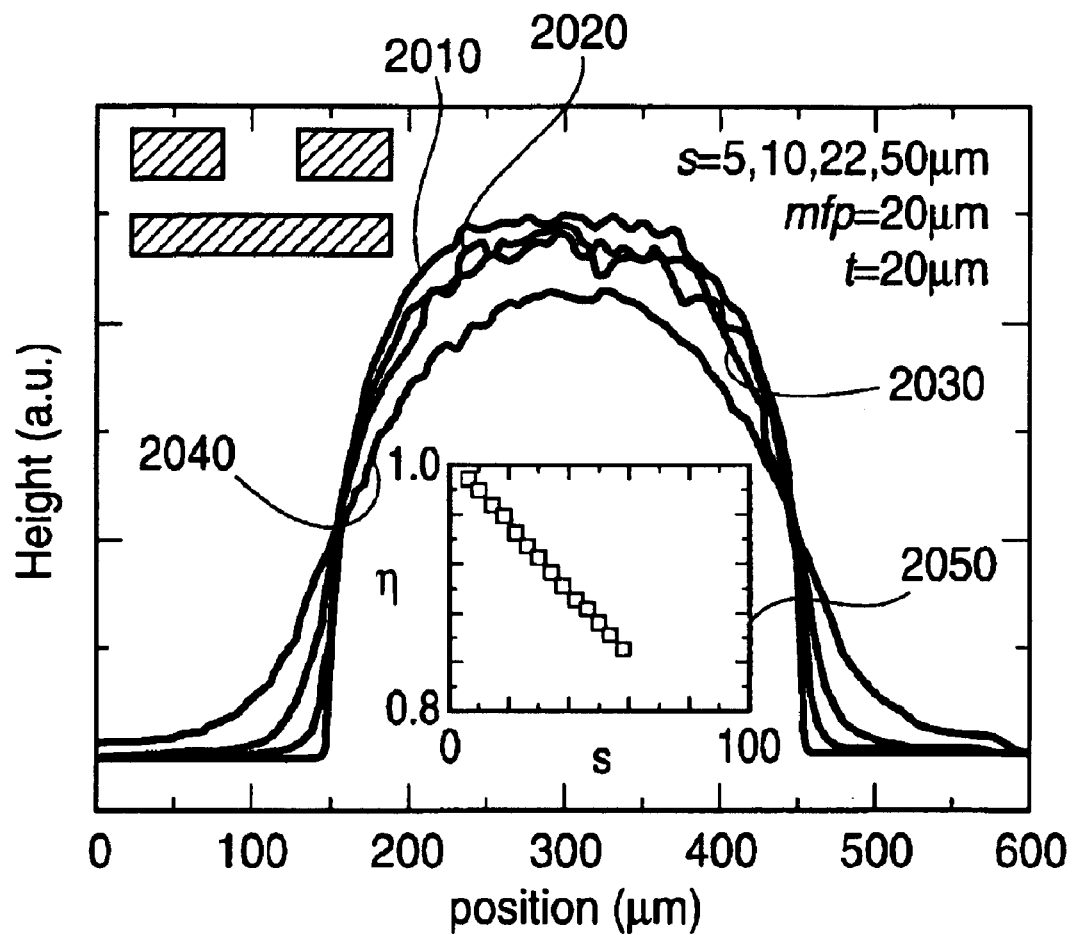
FIG. 20 shows simulated deposition results, illustrating the effect of varying mask-substrate separation.

FIG. 20 shows profiles of simulated organic layers similar to layer 1630 of FIG. 16, but generated with different parameters. The mask separation, s, can vary due to bowing under gravity (in VTE), or possibly heating during the deposition process. Plots 2010, 2020, 2030 and 2040 show profiles for depositions where s=2, 10, 22, and 50 $\mu$m, respectively. For each of the plots, t=20 $\mu$m, w=300 $\mu$m, and mfp=20 $\mu$m. Appreciable edge broadening may arise due to collisions in the mask-substrate gap for s>mfp. In addition, the doming of the middle of the deposit is also pronounced and, in contrast to the case of large t/w, is accompanied by the broadening of the pixel edges. The inset of 2050 of FIG. 20 plots $\eta$ vs. s for this series of depositions, showing a rapid decrease in $\eta$ with s. Thus, optimal pattern resolution leading to a rectangular deposit is achieved for the smallest s and t. Since OVPD can, in principle, be carried out with the mask positioned above the substrate, thin masks can be used without compromising small s values due to mask bowing, which would otherwise occur in VTE. One drawback of thin masks is that they are more susceptible to thermally and mechanically induced stresses.

Figure 21:
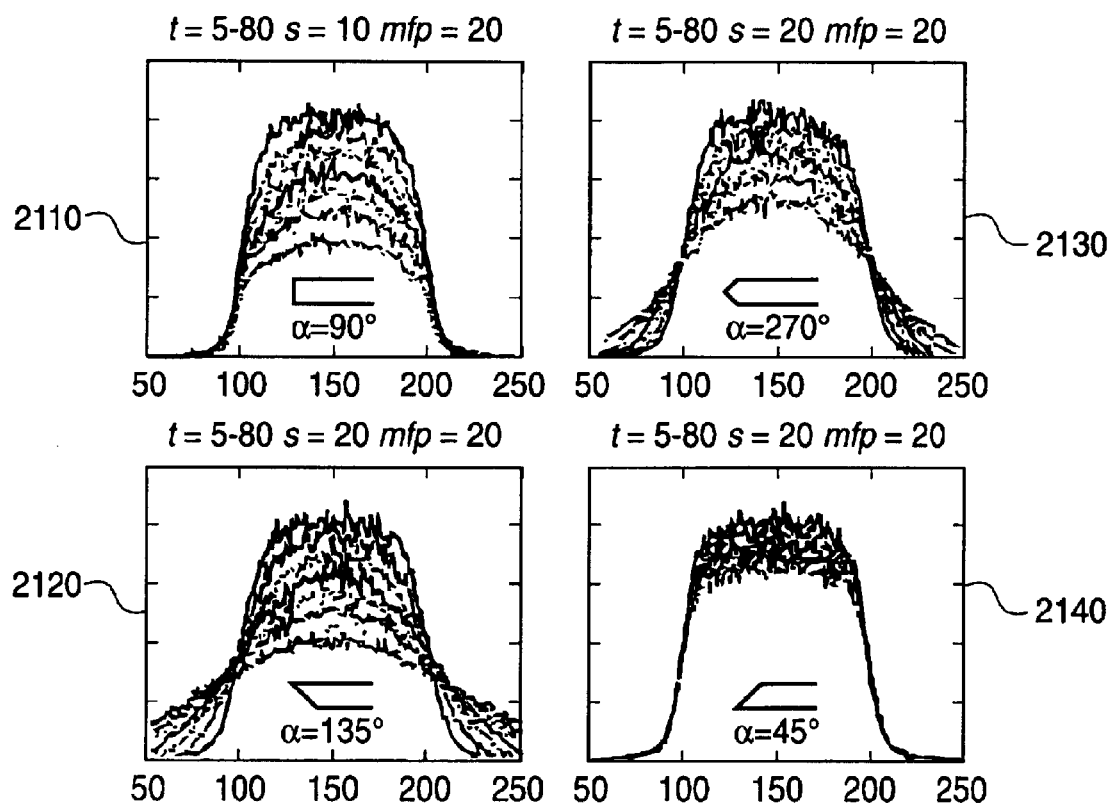
FIG. 21 shows simulated deposition results, illustrating the effect of different mask side-wall geometries at various mask thicknesses.

FIG. 21 shows profiles of simulated organic layers similar to layer 1630 of FIG. 16, but generated with different parameters. The profiles of FIG. 21 illustrate the effect of different side-wall angles. Graph 2110 shows profiles generated with a side-wall angle $\alpha$ of 45 degrees. s was 10 $\mu$m, mfp was 20 $\mu$m, and the mask thickness t was varied between 5 and 80 $\mu$m to generate the different profiles of graph 2110. Graphs 2120, 2130 and 2140 were generated using the same parameters as graph 2110, except that $\alpha$ was 135, 270, and 45 degrees, respectively. FIG. 21 shows that is possible to minimize t at the aperture edge, while keeping the mask thick elsewhere.

Figure 22:
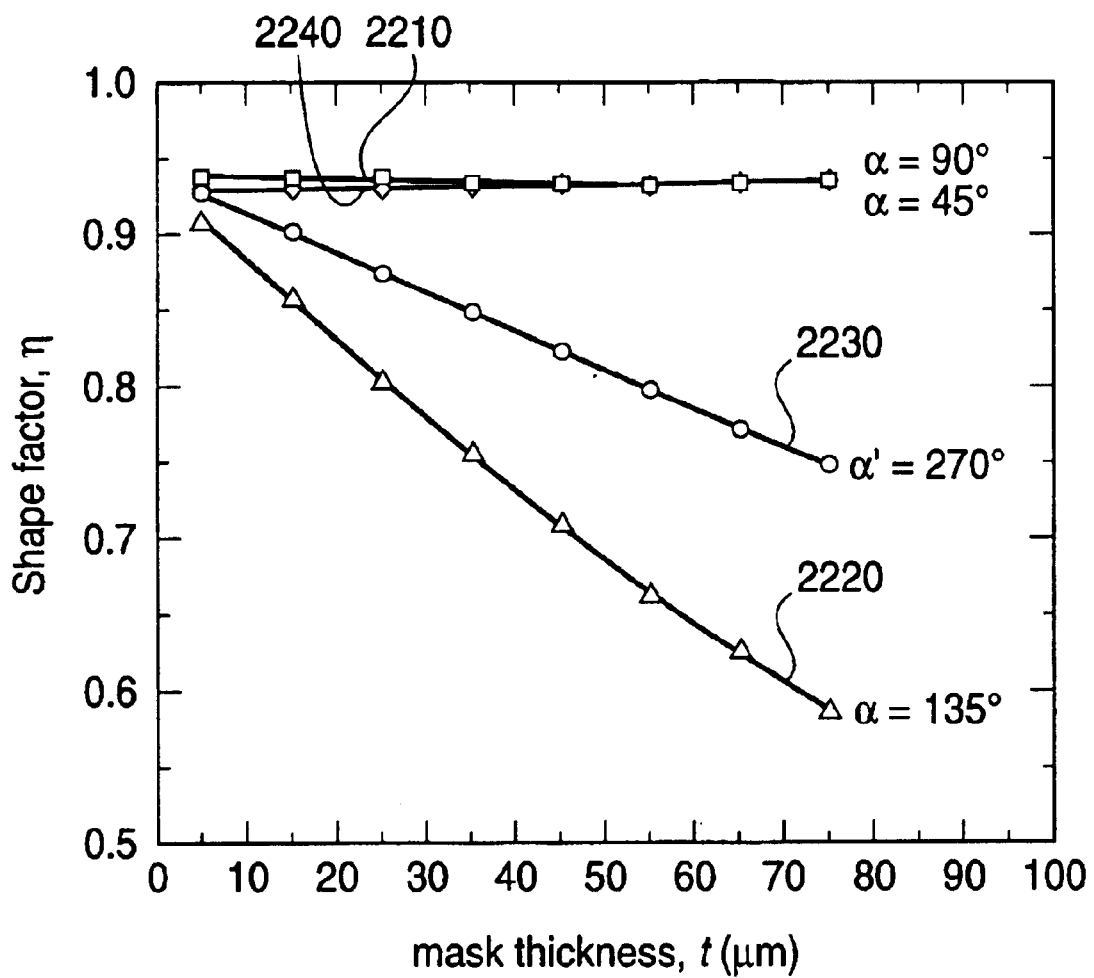
FIG. 22 shows shape factor as a function of mask thickness for the different side-wall geometries of FIG. 21.
Figure 23:
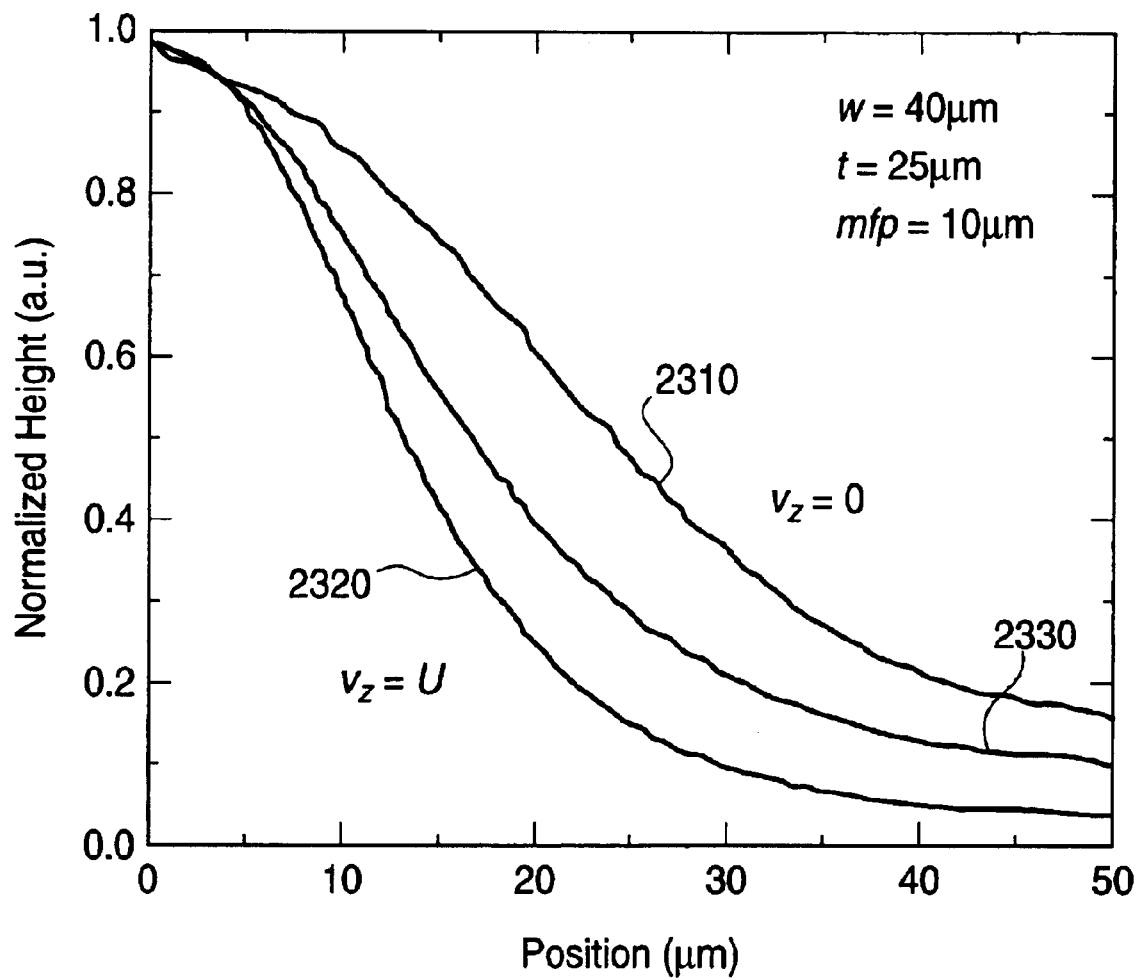
FIG. 23 shows simulated normalized height as a function of position under different assumptions about bulk flow velocity.

FIG. 22 shows plots of shape factor v. mask thickness, based on the profiles of FIG. 21. Plots 2210, 2220, 2230 and 2240 are based on the graphs 2110, 2120, 2130 and 2140, respectively. The variation in $\eta$ with the aperture shape was investigated by varying the aperture side-wall angle, $\alpha$=45, 90, 135, and $\alpha'$=270°. The aperture with $\alpha$=135° results in the most diffuse pixels due to the lack of collimation of the approach angle of physisorbing molecules. This occurs to a lesser extent with the biconical aperture ($\alpha'$=270°), but the sharpest patterns are achieved with $\alpha$=90° and $\alpha$=45° geometries. In addition to allowing deposition of sharp patterns, these aperture angles result in the greatest deposition efficiency for a given deposit shape, while being more structurally robust than the other mask shapes for a given t.

As the mfp increases (corresponding to decreasing $P_{dep}$) the molecules keep more closely to their original bulk flow velocity as they enter and propagate through the boundary layer. In this case, the trajectories become, on average, more collimated, and the deposition profiles become sharper. FIG.

23 shows plots of normalized height v. position for three cases. Plot 2310 shows a profile generated under purely diffusive deposition. Plot 2320 shows a profile generated where the bulk transport velocity (set to one tenth of the average thermal velocity) was added to the z-component of the thermalized velocity vector of the carrier gas molecules. Plot 2330 is an intermediate case, where the z-directed velocity of the carrier molecule decreases inversely with its proximity to the substrate. The purely diffusive case results in the least sharp deposit edges, while plot 2320 yields the sharpest patterns. The actual deposition mechanism is likely to be bound by these two extremes, accounting for the complex hydrodynamics of the carrier gas flow, and where the heavy organic molecules retain a fraction of the z-directed component of the bulk carrier gas flow.

Figure 24:
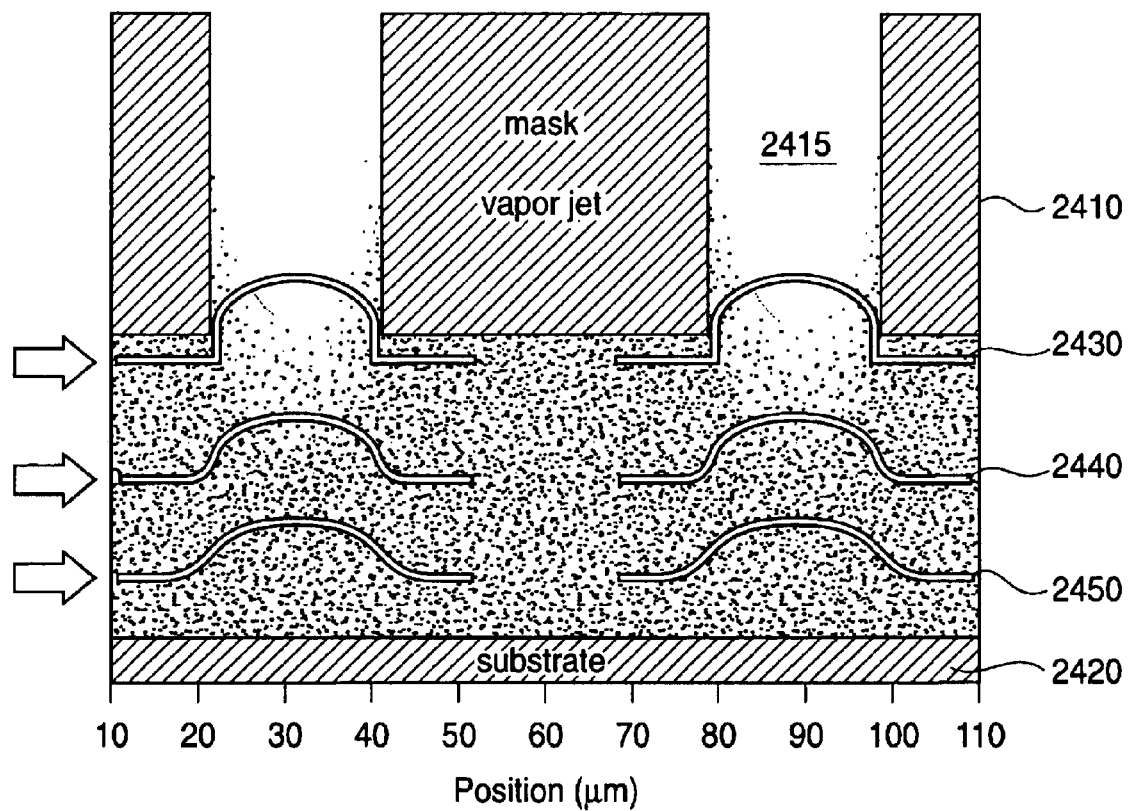
FIG. 24 shows simulated OVPD deposition results where the carrier gas has a bulk flow velocity.

Consider a jet of carrier gas delivered through a small-diameter capillary onto a cooled substrate. In the Monte-Carlo simulation, the z-directed carrier gas velocity, $U_z$, can be increased to simulate a jet which broadens only by the isotropic random molecular velocities superimposed onto this flow-field. FIG. 24 shows the spatial concentration profile for a simulated jet of $N_2$ carrying $Alq_3$, with mfp=10 $\mu$m, t=50 $\mu$m, and $U_z$=100 m/s, while the mean thermal speed, $\bar{u}$=500 m/s. Since the flow-field was not known in this flow regime, the simulation kept $dU_z/dz=0$ for simplicity. The figure shows that the collimated jet can result in a deposit with well-defined edges even for s>>mfp. Careful selection of U, $P_{dep}$, α and s may thus enable a printing method for molecular organic thin films analogous to ink-jet printing for polymers, except where the liquid solvent is replaced by a jet of highly volatile inert carrier gas. In FIG. 24, carrier gas with organic molecules is ejected from apertures 2415 in mask 2410, to impinge upon substrate 2420. Plots 2430, 2440 and 2450 illustrate different simulated deposition results where the jet nozzle is located at different distances from the substrate, and show a widening of the vapor jet as it moves further from the nozzle.

Additional Experimental

Figure 25:
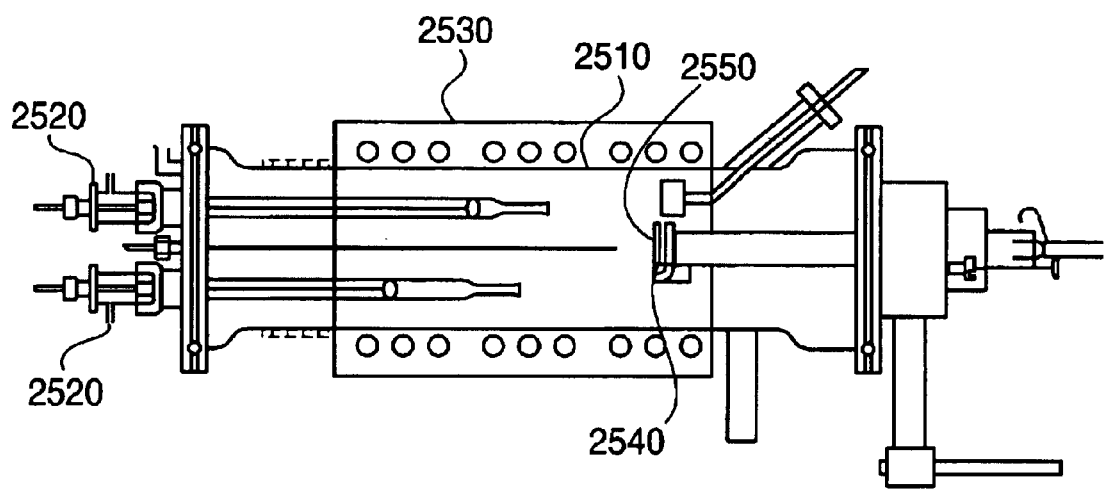
FIG. 25 shows a schematic diagram of an experimental OVPD system.

The deposition of organic thin films of $Alq_3$ was carried out using a multi-barrel Quartz deposition system with in situ temperature and thickness measurement capability. FIG. 25 shows an illustration of the deposition system. An 11 cm diameter by 150 cm long Quartz cylinder 2510 serves as the chamber walls. The cylinder is fitted at the upstream end with 4 evaporation source barrels 2520 (only 2 are visible in FIG. 25), which consist of 2.5 cm diameter by 100 cm long Quartz barrels individually encasing quartz evaporation cells. The main tube is heated by means of a three-zone furnace 2530 enabling source temperature control via positioning of each cell along the temperature gradient within the tube. Carrier gas is flown on the inside of cylinder 2510 as well as each of the source barrels 2520, regulated by mass flow controllers, while the deposition pressure is kept between 0.1 and 10 Torr by adjusting the pump throttle valve and the total carrier flow rate from 10 to 100 sccm. A 40 lpm vacuum pump with a liquid nitrogen cold trap is used to exhaust uncondensed carrier and organics. Organic molecules from the vapor phase physisorb onto a rotating water-cooled substrate 2540, positioned behind a mechanically operated shutter 2550. Film thickness and growth rate are monitored by a quartz crystal microbalance calibrated using the ellipsometry to measure organic film thickness at the end of the growth cycle. The system of FIG. 25 was also used to generate experimental results discussed earlier.

The deposition profiles of organic thin films obtained using OVPD were compared with those from a conventional vacuum thermal evaporator. The source-to-substrate distance was approximately 30 cm; the deposition pressure was maintained at $10^{-6}$ Torr.

Three types of shadow-masks were used. One was a 60 $\mu$m thick, 1 cm×1 cm molybdenum square with circular openings having diameters of 1000, 500, and 100 $\mu$m. The aperture profile in this mask was cylindrical in shape (α=90°). Another mask employed was a 75 mm thick molybdenum sheet with circular apertures having nominal diameters of 1000, 300, and 100 $\mu$m. The openings in this mask had a double-beveled edge, forming a biconical aperture (α'=270°). The third mask type was a Ni mesh, 3.5±0.5 $\mu$m thick, with square openings of 7.5 and 12.5 $\mu$m nominally, separated by equally wide lines. The masks were fixed to silicon substrates using a retainer ring. The mask-substrate separation was controlled by using shims of multiple layers of the Ni mesh placed between the Si substrate and the Mo mask bottom surface. In depositions through the Ni meshes, 1 cm×1 cm sheets of the meshes were fixed to the substrate by sandwiching them between the substrate and the first or second types of mask, and then clamped to the holder by the retainer. Due to the profile of the Ni mesh, the smallest effective separation was 1.0±0.5 $\mu$m, but could be greater in some places due to the flexibility of the mesh itself.

Figure 26:
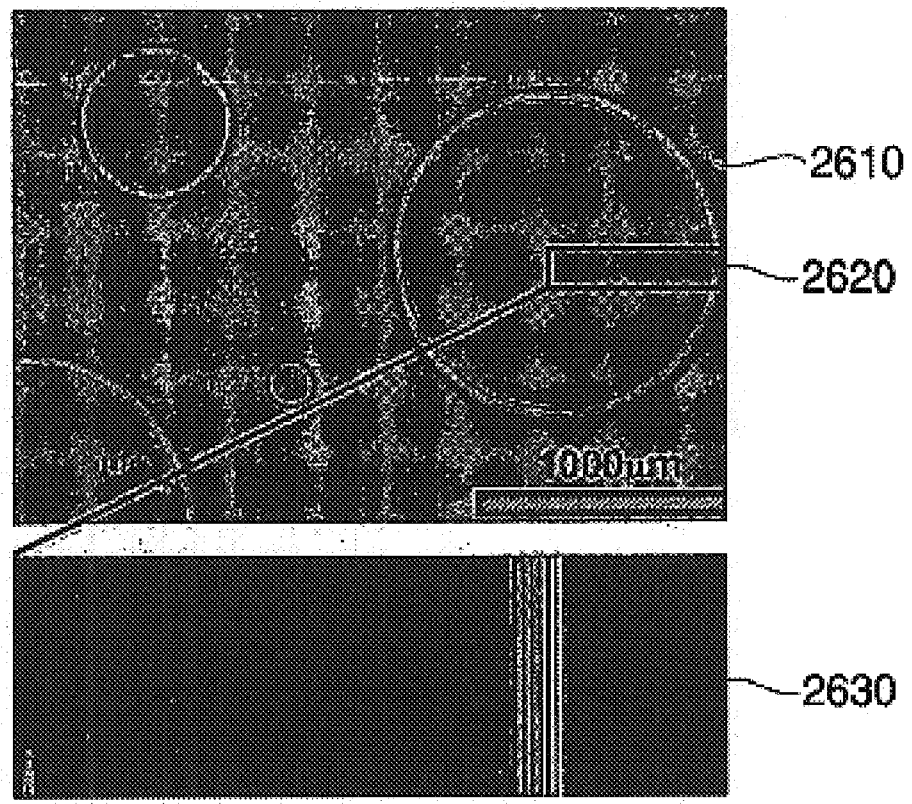
FIG. 26 shows a micrograph of $Alq_3$ layers deposited by OVPD on Si, and interference microscopy results showing fringes near the edge of the layer.

Analysis of the deposited pattern profiles was performed using scanning electron microscopy (SEM) and atomic force microscopy (AFM) for the smallest pixel sizes, and interference microscopy for the larger pixels. The latter method entailed illuminating the substrates with monochromatic light (λ=540±10 nm) and observing the fringe patterns formed at the sloping edge of the bell-shaped pixel. FIG. 26 shows an example of the images obtained. Image 2610 shows SEM microscopy results for circular pixels (α=90°) deposited by OVPD. The cylindrical aperture mask used for this deposition included pixel diameters of w=100, 300, and 1000 $\mu$m. Image 2630 shows interference microscopy results for region 2620 of image 2610.

Figure 27:
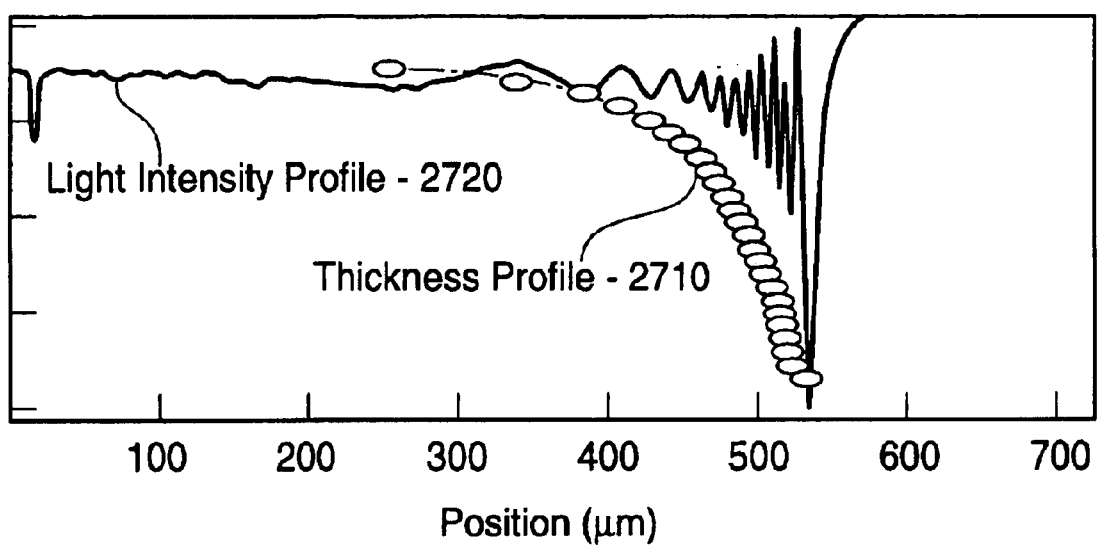
FIG. 27 shows a plot of the light intensity from interference microscopy along the radius of the layer of FIG. 26, and the corresponding pixel height profile calculated from the interference pattern.

FIG. 27 shows a thickness profile 2710 of the image from FIG. 26, extracted from the digitized pixel image by counting the number of fringes from the edge (plot 2720) and using:

$$H = m\frac{\lambda}{2}\frac{1}{n} \qquad (12)$$

where H is the pixel thickness, m=0, 1, 2, 3, etc. is the fringe order, λ=540 nm, and n=1.74 is the refractive index of $Alq_3$.

Figure 28:
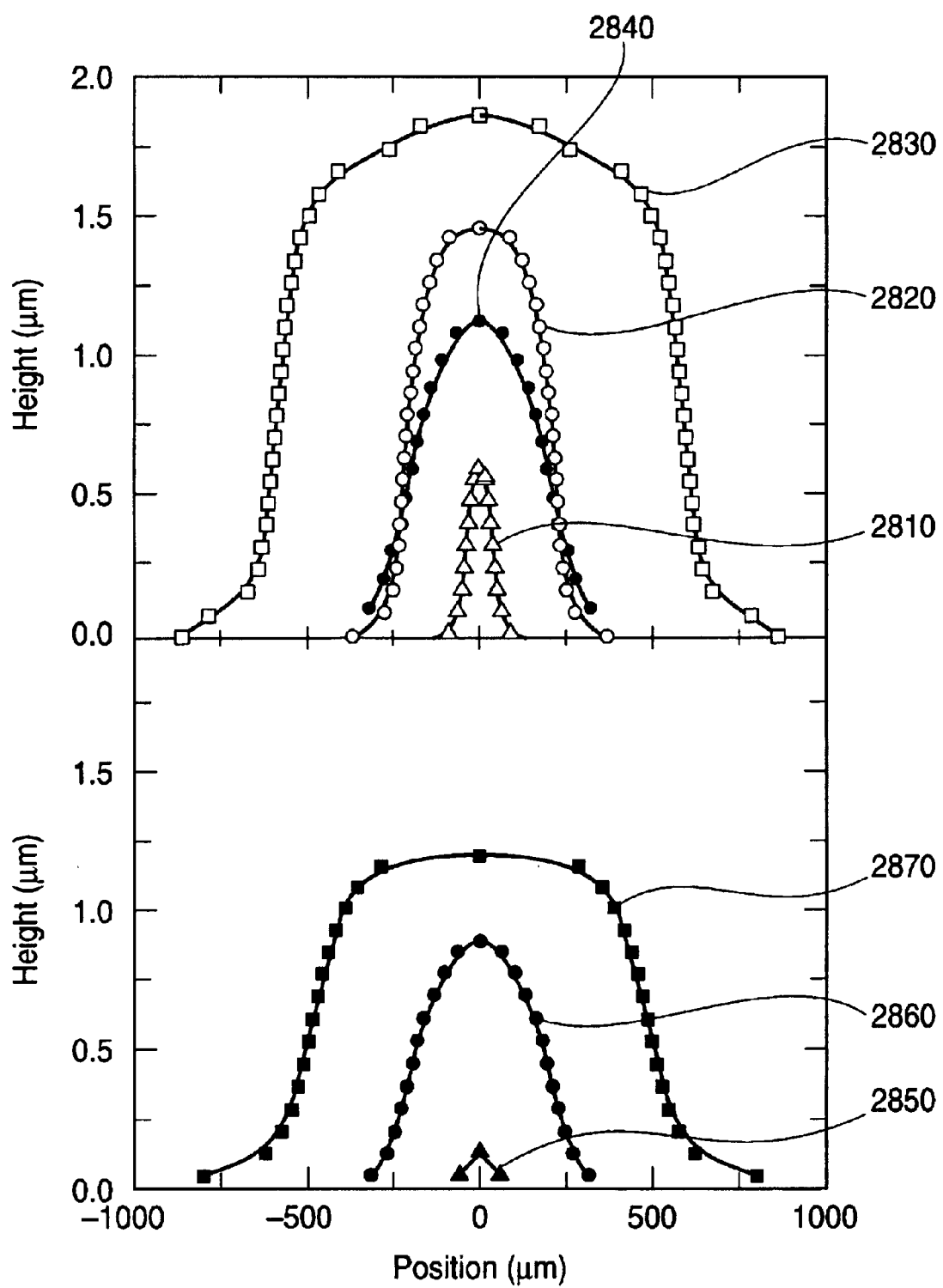
FIG. 28 shows experimentally measured profiles for the layers of FIG. 26.

FIG. 28 shows measured pattern profiles for the deposited layers of FIG. 26. Plots 2810, 2820, and 2830 show profiles for the 100, 300 and 1000 $\mu$m diameter layers, respectively, each with s=0 $\mu$m, and t=50 $\mu$m. Plots 2850, 2860, and 2870 show profiles for the 100, 300 and 1000 $\mu$m diameter layers, respectively, each with s=40 $\mu$m, and t=$\mu$m. Plot 2820 corresponds to a film nominally 2 $\mu$m thick, while plot 2860 corresponds to a film nominally 1.6 $\mu$m thick. Plot 2840 shows plot 2860, normalized to plot 2820 by multiplying by 2/1.6, and superimposed on plot 2820. These plots indicate that the pixel deposition efficiency (inferred from the area under each profile) decreases with the aperture aspect ratio, t/w. The doming of the middle portion of each pixel for greater t/w is similar to that observed in the simulation (see FIG. 19). By comparing the normalized s=0 $\mu$m and s=40 $\mu$m curves it is evident that increasing s decreases the efficiency of pattern deposition (due to condensation on the back of the mask) and edge sharpness, as predicted by the simulation (see FIG. 20 and related discussion).

Figure 29:
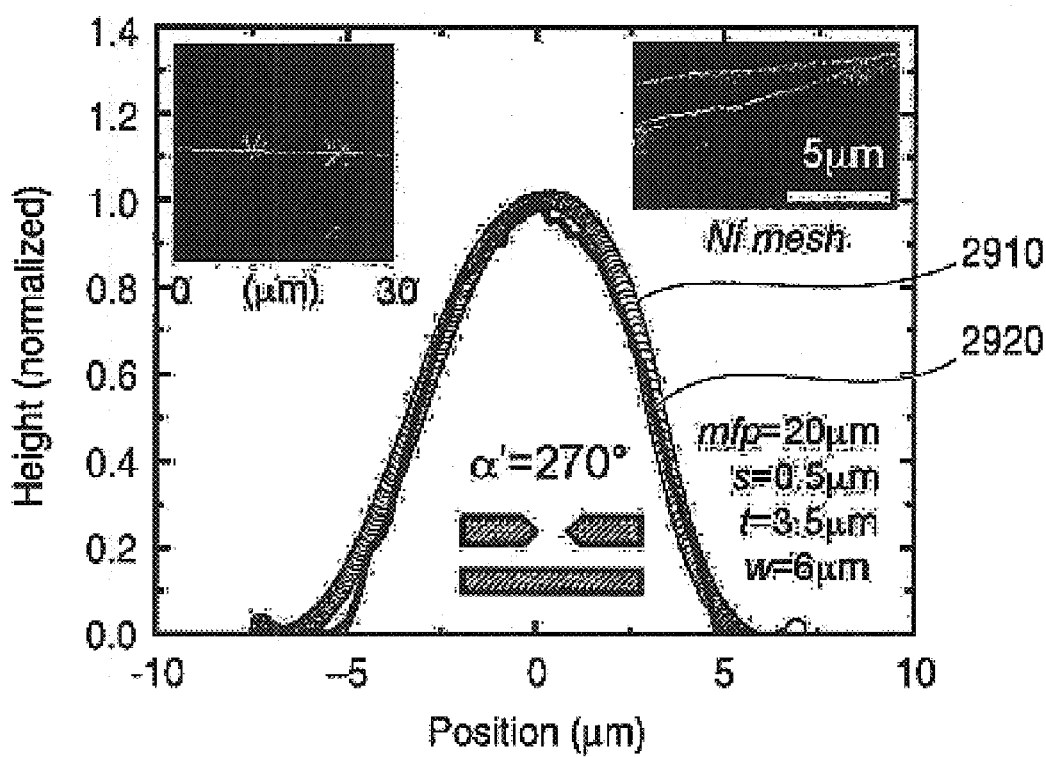
FIG. 29 shows experimental and simulated results for OVPD through a shadow mask.

The highest resolution patterns by OVPD thus far have been achieved using a masking set-up where the Ni mesh is sandwiched between the substrate surface and one of the thicker masks. A sample patterned Alq$_3$ film deposited by OVPD at P$_{dep}$=0.1 Torr was imaged using atomic force microscopy (AFM), illustrated in FIG. 29. Here, a Ni mesh with t≈3 μm and w≈6.0 μm nominally was used as a mask (cross-section SEM shown in the inset of FIG. 29), with a likely s<1 μm. The edge sharpness is about 3 μm, obtained from the thickness profile 2910 (circles) extracted from the image in the inset of FIG. 29. Plot 2920 shows a simulation result (solid line). The experimental pattern profile is well-fitted by the simulation, using w=6.0 μm, t=3.5 μm, s=0.5 μm, mfp=20 μm and α'=270°. The simulated and experimental dimensions are nearly identical, suggesting that the stochastic simulation may accurately describe the patterned deposition mechanism.

Figure 30:
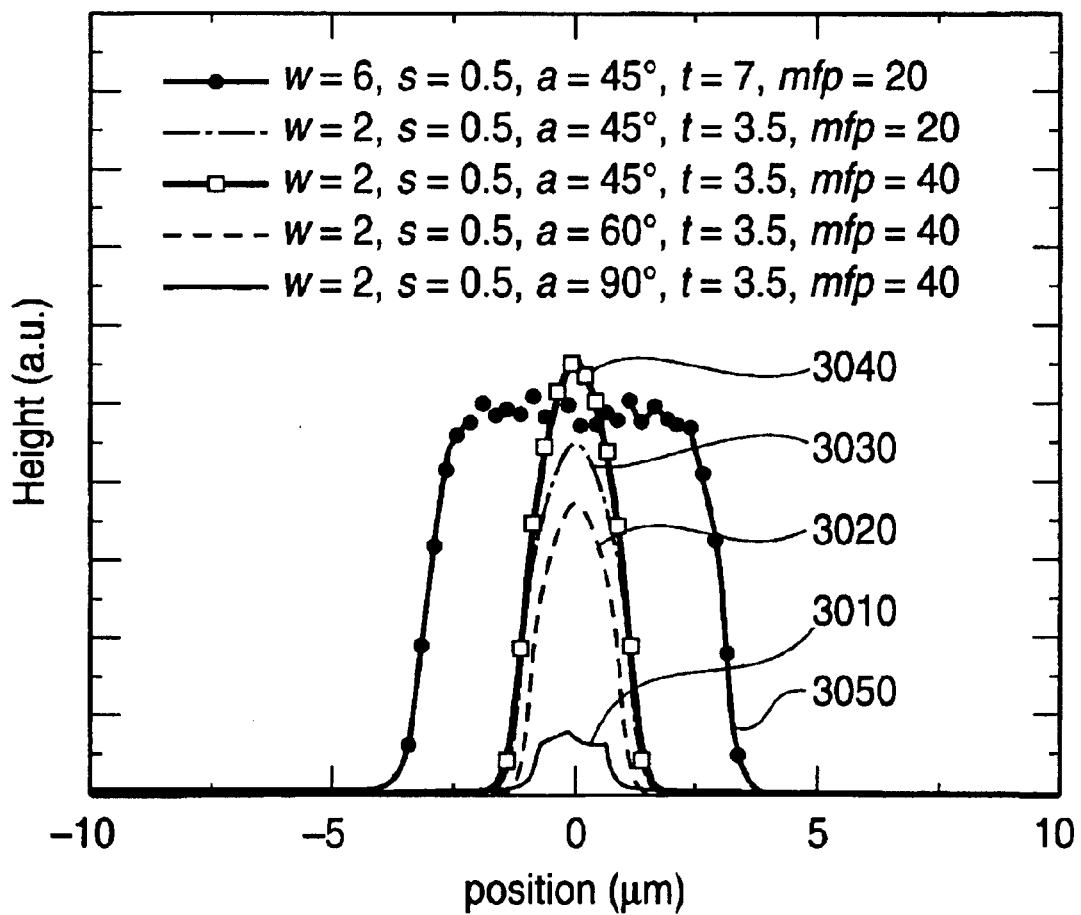
FIG. 30 shows simulated results for OVPD through a shadow mask using a variety of parameters.

FIG. 30 shows additional simulation results. Plots 3010, 3020, 3030, 3040 and 3050 show simulated results with various parameters. All plots used s=0.5. All plots used t=3.5 μm and w=2 μm, except plot 3050, which used t=7 μm and w=6 μm. Plots 3010, 3020 and 3040 used mfp=40 μm, while plots 3030 and 3150 used mfp=20 μm. Plot 3010 used α=90 degrees, plot 3020 used α=60 degrees, and plots 3030, 3040 and 3050 used α=45 degrees.

Figure 31:
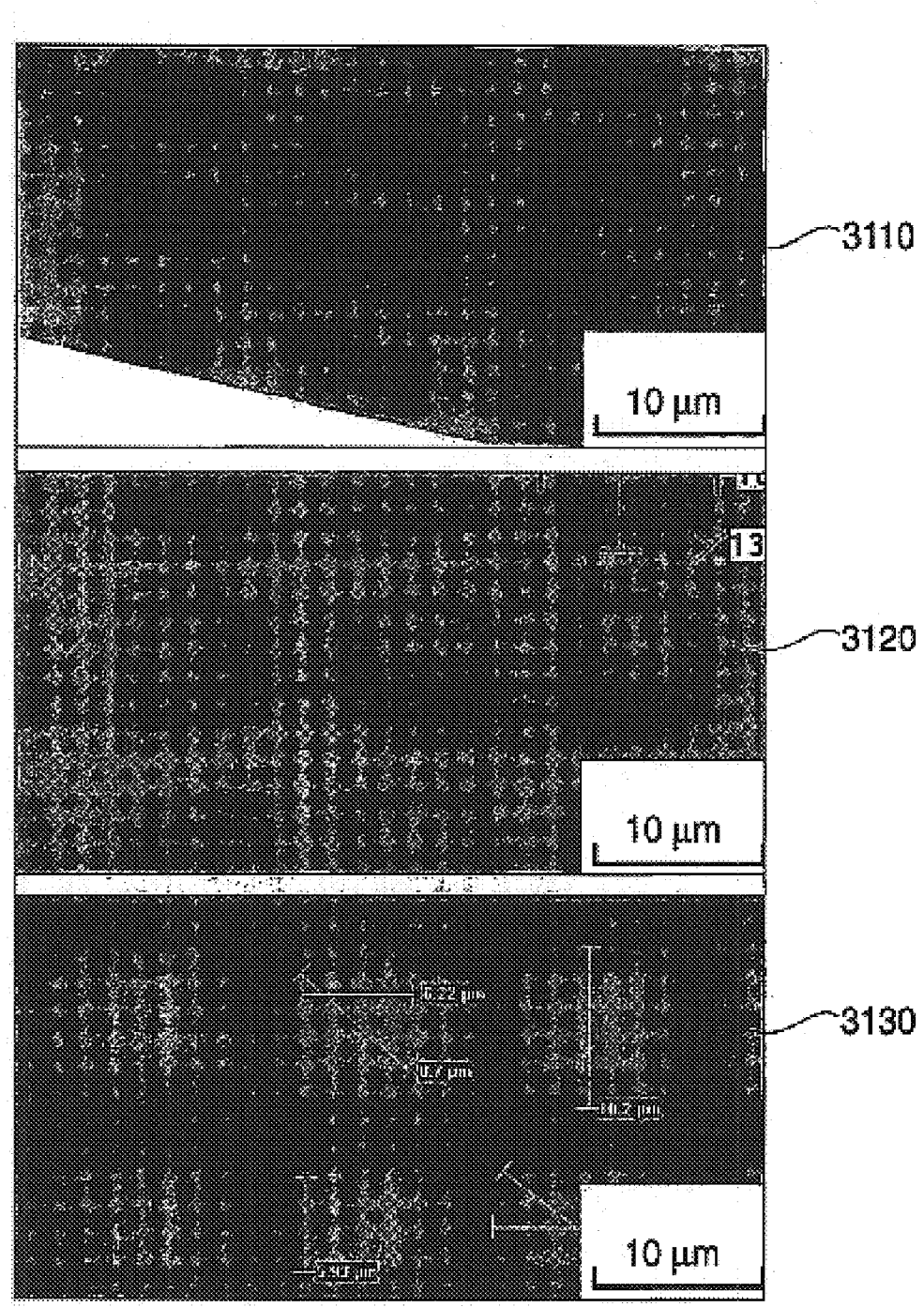
FIG. 31 shows a scanning electron micrographs of an $Alq_3$ film on Si patterned by VTE through a mesh with w=7.5 $\mu$m and s~0 $\mu$m at $10^{-6}$ Torr, and a scanning electron micrograph of $Alq_3$ patterns deposited on Si using OVPD at 0.1 Torr through a nickel mesh with t=3.5 $\mu$m, w=7.5 $\mu$m, and s<1 $\mu$m.

Similar patterns have been obtained for depositions at pressures from 0.1 to 2 Torr, with the lower pressures favoring sharper pixels. Two extreme cases are illustrated by SEMs of deposited films shown in FIG. 31: Image 3110 shows Alq$_3$ patterns deposited on Si by VTE through Ni meshes at P$_{dep}$=10$^{-6}$ Torr and s∼0.5 μm, and image 3120 shows analogous patterns deposited in OVPD at P$_{dep}$=2 Torr. The vacuum-deposited patterns show the trapezoidal profile discussed above, with l$_2$<1 μm, while OVPD patterns have edge dispersion on the order of 1–3 μm. Simulations indicate that if apertures with α=45° with minimal s are used, sub-micron resolution may be achievable.

Figure 32:
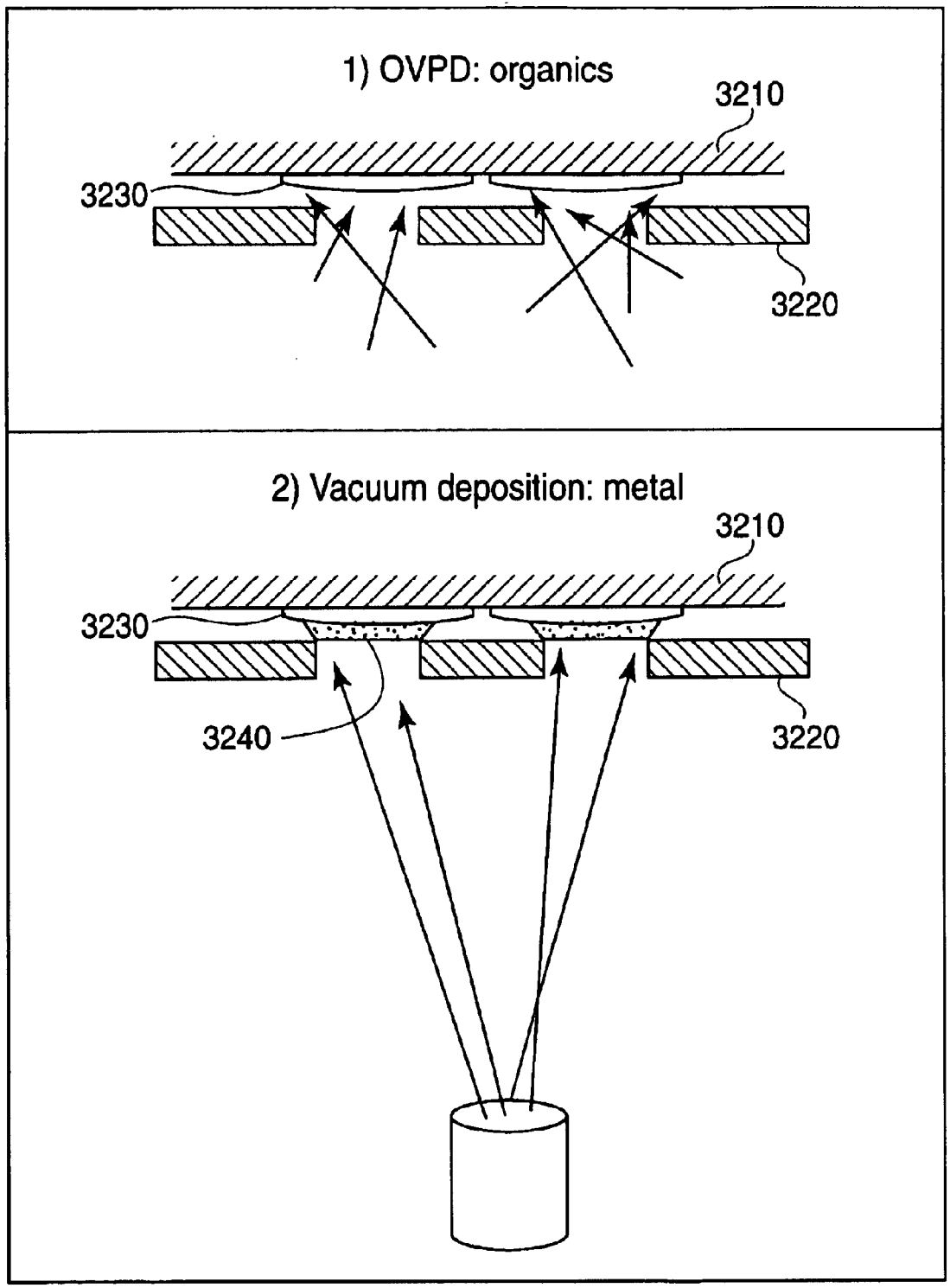
FIG. 32 shows a schematic representation of hybrid deposition.

FIG. 32 shows hybrid deposition through a single mask. A mask 3220 is disposed under a substrate 3210. First, an organic layer 3230 is deposited by OVPD through mask 3220 onto substrate 3210. Then, a metal or metal oxide layer 3240 is deposited by VTE through mask 3220 onto organic layer 3230. Because of differences in the processes, such as base pressure, the organic layer is wider than the metal or metal oxide layer even though it was deposited through the same mask in the same location, without any movement of the mask relative to the substrate during or in between the two deposition processes. This phenomena may be advantageously used to deposit a second layer over a wider first layer, such that the second layer has no contact with any layers underlying the first layer—desirable, for example, when the first layer is a light emitting layer, the second layer is an electrode, and another electrode underlies the organic layer. The order may also be reversed, such that the wider layer is deposited second.

Although the various embodiments describe OVPD and VTE as specific processes for which base pressure and other parameters may be used to control the area of coverage of a deposited layer, the concept may be extended to other deposition techniques, such as sputtering, e-beam, or generally physical vapor deposition. The area of coverage may also be controlled within a particular process. For example, a wide organic layer may be deposited over a narrower organic layer (or vice versa), both by OVPD, but with different OVPD parameters.

It has been shown that OVPD may be used for patterned deposition of organic thin films with micrometer scale resolution. We have found that, due to the low density of carrier gas and organic molecules used in OVPD, the molecular mean free paths are frequently on the order of the mask dimensions, suggesting that Monte-Carlo direct simulations should be used for modeling this process. While it is likely that the deposition takes place largely in the diffusive mode, experimental evidence suggests that organic molecules retain a significant fraction of their velocity due to bulk transport by the carrier gas. As the deposition pressure decreases, the mean free path increases, resulting in sharper pixel edges. Using a heavier carrier gas has no first-order effect on the pixel shape in the diffusive regime, while it can improve edge sharpness in vapor-jet deposition mode. Mask-substrate separations that are smaller than the mean free path of the system will frequently yield trapezoidal pixel profiles found in the line-of-sight vacuum deposition. A thicker mask helps increase pixel edge sharpness, albeit at the detriment of mask-to-substrate deposition efficiency. The simulated vapor-jet deposition process indicates that it may be possible to pattern organics directly by ultra-fast gas jets, where the flow velocity matches or exceeds the thermal velocity of the molecules. This process may result in close to 100% efficient patterned organic vapor deposition. By depositing at the lower end of the pressure range (<10 Pa) and using appropriate aperture shapes (e.g. α<90°) it is possible to achieve sub-micron pattern resolution.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art. While some of the specific embodiments may be described and claimed separately, it is understood that the various features of embodiments described and claimed herein may be used in combination.

What is claimed is:

1. A method of fabricating an organic device, comprising:

a) depositing a first layer of an organic material over a substrate through a mask by organic vapor phase deposition at a base pressure of at least 10$^{-2}$ torr;

b) depositing a second layer of a metal or metal oxide over the first layer through the mask by vapor thermal evaporation at a base pressure of at most 10$^{-6}$ torr wherein the second layer is disposed entirely on the first layer, such that there is no contact between the second layer and any material underlying the first layer.

2. The method of claim 1, wherein the organic device is an organic light emitting device.

3. The method of claim 1, wherein the organic device is an organic transistor.

4. The method of claim 1, wherein the organic device is an organic solar cell.

5. The method of claim 1, wherein the base pressure during the deposition of the first layer is about 0.1–10 torr.

6. The method of claim 1, wherein the method is used to fabricate a passive matrix display.

7. The method of claim 1, wherein the method is used to fabricate an active matrix display.

* * * * *

UNITED STATES PATENT AND TRADEMARK OFFICE
CERTIFICATE OF CORRECTION

PATENT NO.   : 6,716,656 B2
DATED        : April 6, 2004
INVENTOR(S)  : Max Shtein et al.

It is certified that error appears in the above-identified patent and that said Letters Patent is hereby corrected as shown below:

<u>Column 11,</u>
Line 21, change " $P_{coll} = \dfrac{F_N \sigma_{Tl} u_r \Delta t}{v_c}$ " to -- $P_{coll} = \dfrac{F_N \sigma_{Tl} u_r \Delta t}{v_c}$ --.

Signed and Sealed this

Eighth Day of February, 2005

JON W. DUDAS
*Director of the United States Patent and Trademark Office*